United States Patent
Shelnutt et al.

(10) Patent No.: US 10,314,206 B1
(45) Date of Patent: Jun. 4, 2019

(54) MODULATING AHU VS RAM AIR COOLING, BASED ON VEHICULAR VELOCITY

(71) Applicant: DELL PRODUCTS, L.P., Round Rock, TX (US)

(72) Inventors: Austin M. Shelnutt, Leander, TX (US); Edmond I. Bailey, Cedar Park, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 15/962,866

(22) Filed: Apr. 25, 2018

(51) Int. Cl.
| | |
|---|---|
| G06F 1/16 | (2006.01) |
| H05K 5/00 | (2006.01) |
| H05K 7/00 | (2006.01) |
| H05K 7/20 | (2006.01) |
| B60P 3/00 | (2006.01) |
| H05K 7/14 | (2006.01) |

(52) U.S. Cl.
CPC ............ *H05K 7/20836* (2013.01); *B60P 3/00* (2013.01); *H05K 7/1497* (2013.01); *H05K 7/20745* (2013.01); *H05K 7/20181* (2013.01); *H05K 7/20827* (2013.01)

(58) Field of Classification Search
CPC ........... H05K 7/20836; H05K 7/20745; H05K 7/20181; H05K 7/20827; H05K 7/1497; H05K 7/20736; H05K 7/20718; H05K 7/208; H05K 7/20809; H05K 7/20818; B60P 3/00
USPC ................................. 361/694, 695, 696, 697
See application file for complete search history.

(56) References Cited

U.S. PATENT DOCUMENTS

| | | | |
|---|---|---|---|
| 4,934,154 A | 6/1990 | Altoz et al. | |
| 5,253,484 A | 10/1993 | Corman et al. | |
| 6,233,160 B1 | 5/2001 | Shockley | |
| 6,581,544 B1 | 6/2003 | Smith | |
| 8,434,804 B2* | 5/2013 | Slessman | F28F 9/0265 296/24.3 |
| 8,782,443 B2 | 7/2014 | Belady et al. | |
| 8,947,879 B2* | 2/2015 | Broome | H05K 7/1497 165/104.33 |
| 9,001,505 B2 | 4/2015 | Moore et al. | |
| 9,027,326 B2 | 5/2015 | Martin et al. | |
| 9,278,303 B1 | 3/2016 | Somani et al. | |
| 9,380,731 B2* | 6/2016 | Faig Palomer | H05K 7/20745 |
| 9,572,279 B2* | 2/2017 | Tabe | H05K 7/1497 |

(Continued)

*Primary Examiner* — Anthony M Haughton
(74) *Attorney, Agent, or Firm* — Isidore PLLC

(57) ABSTRACT

A velocity cooled (VC) mobile data center (MDC) includes a volumetric container having an air intake opening providing an air intake path for exterior air to ingress into the container at a high velocity to provide a flow of cooling air that cools the heat generating IT equipment operating within the VC MDC while the MDC is mobile. An air intake damper is positioned within the air intake opening and can be selectively positioned between a fully opened position to a fully closed position. The VC MDC includes an air handling unit (AHU) configurable to operate in a standby mode or an active mode, ranging from providing minimal airflow to providing maximum airflow. The level of operation of the IT equipment and the amount of cooling provided by the AHU is controlled, based, in part, on a velocity of the VC MDC and resulting amount of cooling air being ingested.

8 Claims, 23 Drawing Sheets

(56) References Cited

U.S. PATENT DOCUMENTS

| | | |
|---|---|---|
| 9,745,960 B2 | 8/2017 | Dietzel |
| 9,763,365 B2 * | 9/2017 | Stocker ................ H05K 7/1497 |
| 9,772,610 B2 * | 9/2017 | Slessman .................. B31C 9/00 |
| 9,795,062 B1 * | 10/2017 | Ross .................. H05K 7/20745 |
| 9,814,160 B2 | 11/2017 | Slessman et al. |
| 9,839,163 B2 * | 12/2017 | Keisling ............ H05K 7/20745 |
| 2006/0030253 A1 | 2/2006 | Asai et al. |
| 2006/0082263 A1 | 4/2006 | Rimler et al. |
| 2008/0123288 A1 | 5/2008 | Hillis |
| 2012/0226922 A1 | 9/2012 | Wang et al. |
| 2013/0328395 A1 | 12/2013 | Krizman et al. |
| 2016/0102880 A1 | 4/2016 | Lovicott et al. |
| 2016/0198593 A1 | 7/2016 | Schmitt et al. |
| 2016/0231043 A1 | 8/2016 | Casasanta et al. |
| 2016/0376910 A1 | 12/2016 | Sellers et al. |
| 2017/0223867 A1 | 8/2017 | Magcale et al. |
| 2017/0270314 A1 | 9/2017 | Tsybrovskyy et al. |

\* cited by examiner

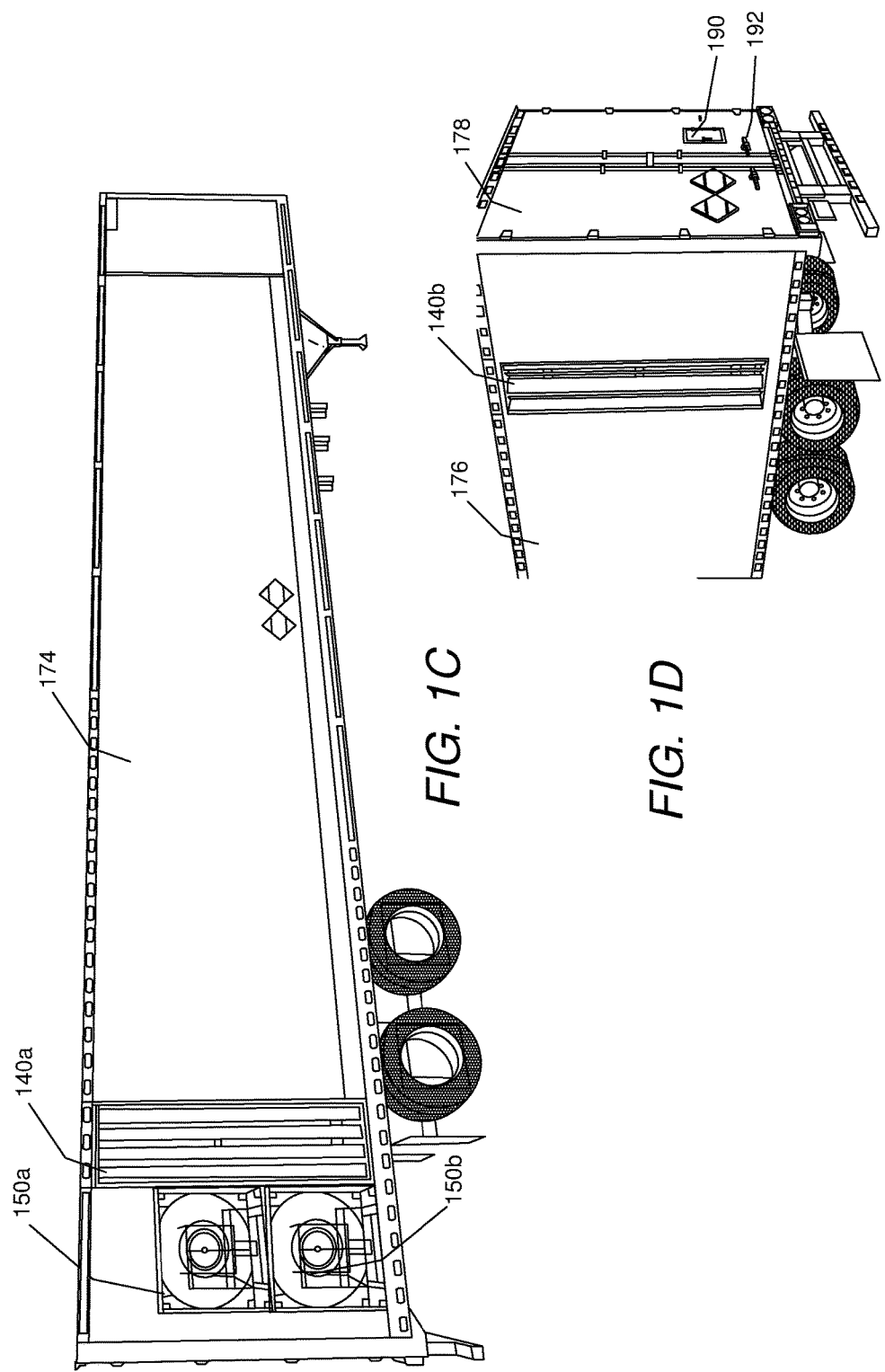

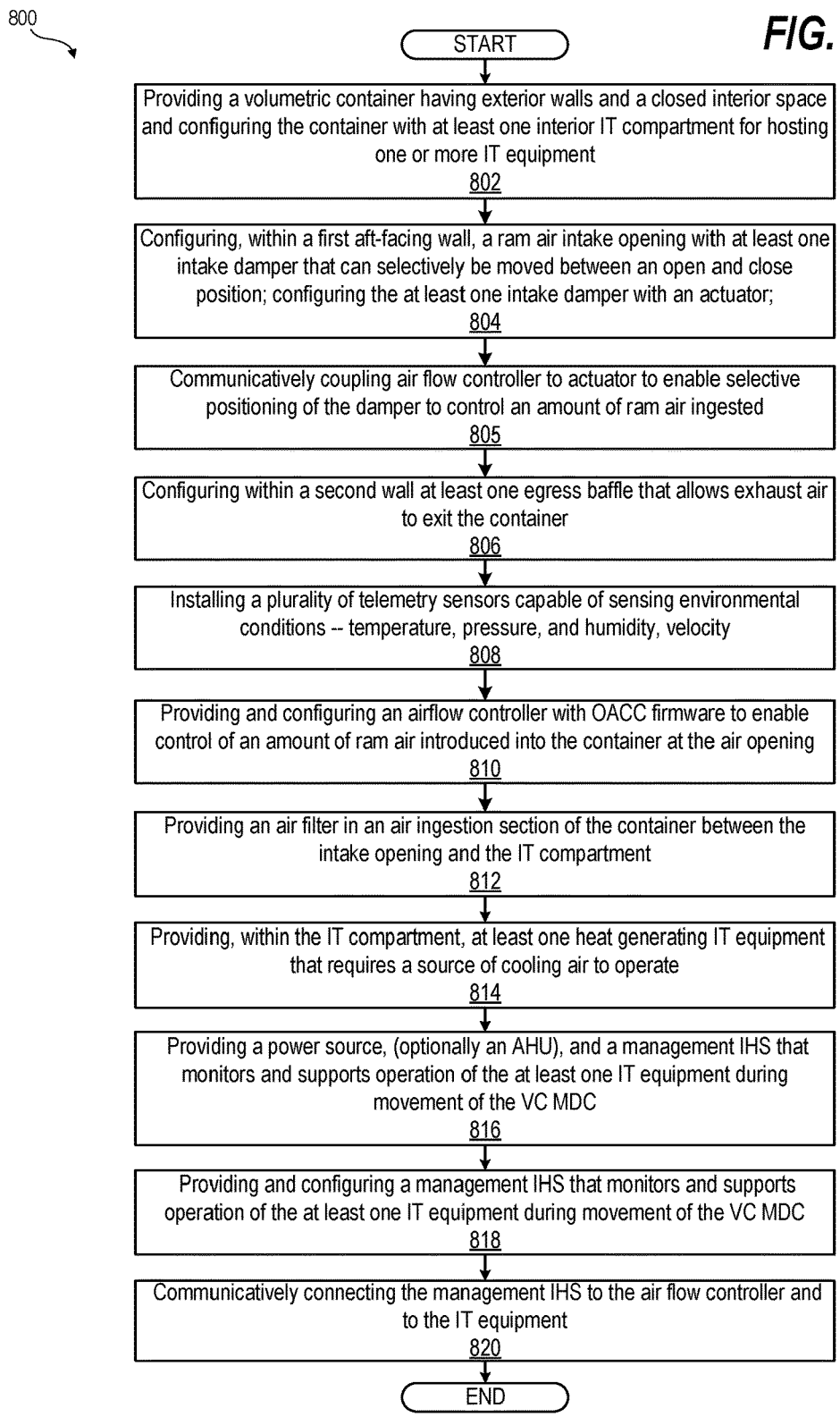

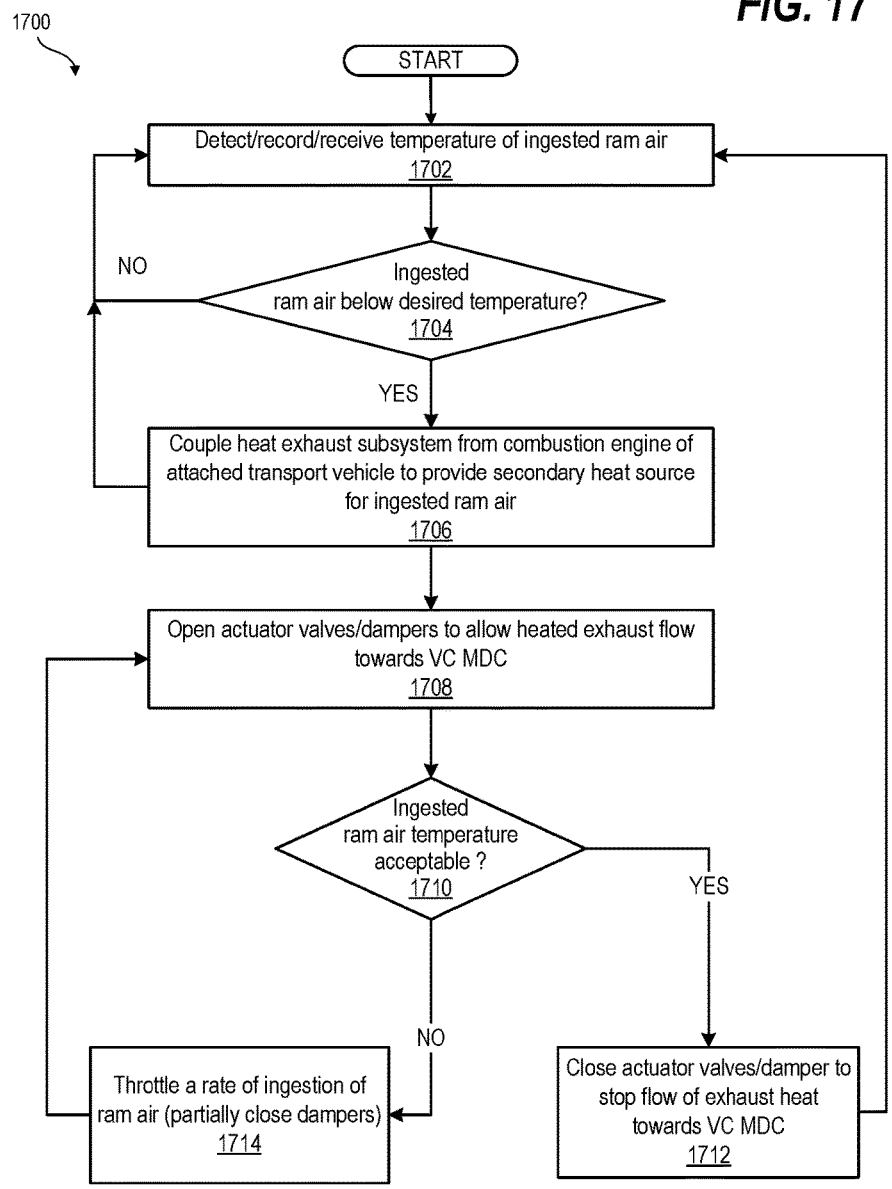

MODULATING AHU VS RAM AIR COOLING, BASED ON VEHICULAR VELOCITY

CROSS REFERENCE TO RELATED APPLICATIONS

The present application is related to the subject matter of the following co-pending patent applications, all filed on even date herewith: Ser. No. 15/962,823; Ser. No. 15/962,846; Ser. No. 15/962,856; and Ser. No. 15/962,880. The content of each of those applications is hereby incorporated herein by reference.

BACKGROUND

Technical Field

The present disclosure generally relates to mobile data centers comprising large scale information handling systems (LIES) and in particular to cooling of a mobile data center.

Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For large scale processing requirements, a large number of information handling systems (e.g., servers) and supporting power and data storage components can be collocated within a data center. Data centers, with potentially hundreds or thousands of servers, storage modules, etc. (collectively information technology (IT) modules) generate large amounts of heat, requiring active cooling sources. Thus, data centers are typically located in a fixed physical location that is pre-configured with access to a large power supply and a separate cooling subsystem including air handling units (AHUs). These AHUs require/consume power to operate and thus have to be accounted for when allocating power to the data center.

Data centers are often located in areas that are remote from the data collection points (e.g., in a different city or state). The collected data remains unprocessed until the data arrives at the data center. Situations exists where the need for large scale processing power would be best provided closer to the location at which the data is collected. Mobile data centers equipped with on-board AHUs and power supplies provide an opportunity to provide some data processing while the data center is moving. Unfortunately, because of the aforementioned need for power consuming, on-board AHUs to keep the IT equipment sufficiently cooled, large scale mobile data centers have heretofore not been practical. Data collected in the field is therefore simply packaged and transported back to the data center.

BRIEF SUMMARY

Disclosed are a system and method for cooling a velocity cooled (VC) mobile data center (MDC). According to a first aspect, a VC MDC includes a volumetric container having a plurality of exterior walls, with a first aft-facing wall and at least one second side or rear facing wall. The container is configured with an information technology (IT) compartment and designed for placement on a trailer capable of being moved in at least an aft-facing direction at a velocity that facilitates cooling air flow through the IT compartment. At least one heat generating information technology (IT) equipment is positioned within the IT compartment. The IT equipment includes at least one information handling system (IHS). An air intake opening is placed in the aft-facing wall and provides an air intake path for exterior air to ingress into the container at a high velocity. The high velocity exterior air ingestion provides a flow of cooling air that cools the at least one heat generating IT equipment while the trailer is moving in the aft direction. An air intake damper is positioned within the air intake opening. The damper is capable of being selectively positioned in one of a plurality of air intake positions, ranging from a fully open position to a fully closed position.

The VC MDC further includes at least one air handling unit (AHU) located within a second compartment of the container. The at least one AHU is configurable to selectively operate in one of a standby mode and an active mode, ranging from a first active mode providing minimal airflow to a second active mode providing a maximum airflow. The AHU is selected to operate in the active mode based on an amount of cooling air being ingested at the air intake opening. When in an active mode, the VC MDC operationally pulls air from a front section of the container to a rear section of the container, mechanically causing ingestion of cooling air and directional movement of the ingested cooling air over the at least one heat generating IT equipment to convectionally remove heat generated by operation of the at least one heat generating IT equipment. The VC MDC also includes a management IHS that controls the operation of the IT equipment and the at least one AHU, based in part on a velocity of the VC MDC.

In one embodiment, the VC MDC includes an actuator connected to the air intake damper. The actuator enables positioning of the air intake damper into one of the plurality of air intake positions. A controller is communicatively coupled to the actuator and provides a trigger signal to the actuator to direct the actuator to place the air intake damper into a specific air intake position. Also, the VC MDC includes at least one air outflow opening. The outflow opening includes an air outflow damper and is positioned in one of the walls of the volumetric container. The at least one air outflow opening is positioned to enable the flow of cooling air to exit the container, as exhaust IT air, after the cooling air flows over and convectionally absorbs heat from the at least one IT equipment. A second actuator is connected to the air outflow damper and enables positioning of the at least one air outflow damper into one of a plurality of air outflow positions. The controller is communicatively coupled to the second actuator and provides a trigger signal to the second actuator to direct the second actuator to place the air outflow damper into a specific air outflow position.

The VC MDC further includes at least one sensor communicatively coupled to the controller and which senses a respective at least one environmental or ambient condition. The controller receives a value of the respective at least one environmental or ambient condition and selects the specific air intake position of the air intake damper, based on a received value from the at least one sensor. The controller responds to detection of a condition that requires use of the AHU to provide cooling air flow by activating the AHU to begin circulating cooling air within the container. The controller further responds to detection of a condition that indicates the VC MDC should operate in a closed mode by triggering the actuator to close the air intake damper.

According to a next aspect, the method includes determining if a velocity of the VC MDC is above a minimum threshold velocity that enables ram air cooling of IT equipment within the VC MDC. In response to the velocity not being above the minimum threshold velocity, the method includes activating a secondary cooling source to provide a flow of cooling air across the IT equipment within the VC MDC. The method further includes modulating an amount of cooling being provided by the secondary cooling source, based on a velocity of the VC MDC movement and a resulting amount of ram air flow induced by the VC MDC movement. The method further includes throttling operation of the IT equipment to conserve an amount of power required to cool the IT equipment, which is the power consumed by the secondary cooling source.

In one embodiment, the method includes monitoring the velocity of the VC MDC relative to the threshold minimum velocity and in response to the velocity of the VC MDC being at or above the threshold minimum velocity, de-activating the secondary cooling source. The secondary cooling source is an air handling unit (AHU) powered by an on-board power supply.

The method further includes detecting that an externally powered secondary cooling source is being utilized to provide required cooling to the at eat one IT equipment and triggering the at least one IT equipment to resume full processing operation while the externally powered secondary cooling source is being utilized to provide the cooling.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIGS. 1A-1D presents block diagram illustrations of different views of an example velocity cooled (VC) mobile data center (MDC) configured to provide velocity-generated ram air-cooling that enables data processing by the MDC during data collection and transportation in the field, according to one or more embodiments;

FIG. 8 is a flow chart illustrating an example method of manufacturing and/or provisioning a VC MDC to enable ram air cooling of during processing by IT equipment within the VC MDC, while the MDC is moving in the field, according to one or more embodiments;

FIG. 17 is a flow chart illustrating one example of the method by which the temperature of the VC outside air is modulated using residual/exhaust heat from the combustion engine of the transport vehicle to provide proper ambient conditions for the operation of the IT equipment within the VC MDC, according to one or more embodiments.

DETAILED DESCRIPTION

Figure 1A:
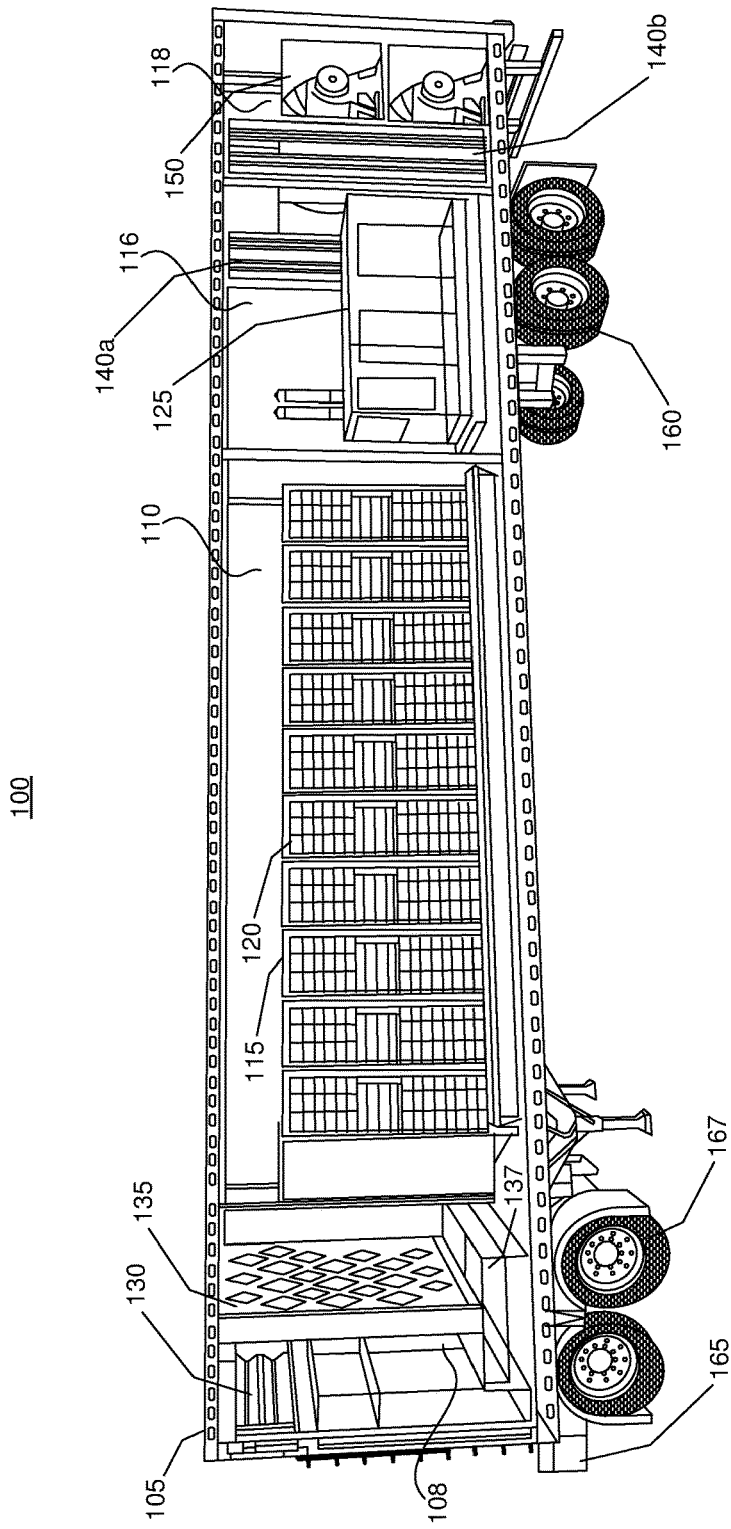

The illustrative embodiments provide a velocity cooled (VC) mobile data center (MDC), a system, and a method that enable large-scale data collection and information handling system (IHS) computation of collected data that is supported by velocity-generated ram air cooling during transportation of the MDC. The VC MDC includes a volumetric container having an air intake opening providing an air intake path for exterior air to ingress into the container at a high velocity to provide a flow of cooling air that cools the heat generating IT equipment operating within the VC MDC, while the MDC is mobile. An air intake damper is positioned within the air intake opening and can be selectively positioned between a fully opened position to a fully closed position. The VC MDC includes an air handling unit (AHU) configurable to operate in a standby mode or an active mode, ranging from providing minimal airflow to providing maximum airflow. The level of operation of the IT equipment and the amount of cooling provided by the AHU is controlled, based, in part, on a velocity of the VC MDC and resulting amount of cooling air being ingested As utilized herein, the term "ram air" generally refers to air that is pushed at a high velocity into an opening of a wall of an MDC as a result of movement of the MDC. According to a first aspect, a velocity cooled (VC) MDC (hereinafter VC MDC) is configured to provide velocity-generated air-cooling for the information technology (IT) equipment operating within the VC MDC to complete data collection and data processing operations. A plurality of functional features of the VC MDC are presented herein, with reference to the various figures. Major sections of the description are presented with a heading. However, it is appreciated that the headings are provided only to highlight specific aspects of the broader disclosure, without limitation or exclusivity with regards to the other aspects of the disclosure.

According to one embodiment, the VC MDC is an iso-container or a grouping of modular sub-assembly containers placed on a wheeled transport (trailer). The container is a volumetric enclosure having exterior walls and a ceiling and floor. The container is supported by physical affordances for facilitating movement of the container/trailer along a travel path. The trailer also includes connection affordances for connecting to an engine/motor that enables the lateral movement of the container via at least one of a pull, push, levitation, or other force applied to/against the container/trailer. During movement of the container by one or more moving forces, exterior air is forced/pulled into air intake dampers and circulated through the interior of the container, passing over the IT equipment to remove heat being generated by the equipment and out the exhaust dampers. This use of convection air flow to cool the IT equipment allows for the VC MDC to provide cooling without the use of the air handling units (AHUs) while the container is moving (or being moved) at a sufficient velocity to provide enough cooling airflow through the container.

According to one embodiment, the container/trailer has a physical enclosure comprising exterior walls, with at least a front sectional wall, lateral side walls, and a rear wall, a floor, and a ceiling. At least a first section of the enclosure and a corresponding section of the floor are configured to house at least a first IT rack comprising a plurality of IT equipment, such as information handling systems. The racks are securely affixed to the floor using one or more latches and connecting affordances to prevent movement of the rack after securing the rack to the floor. The racks include vibration dampers that soften the effects of vibrations on the IT equipment located/housed on the rack while the container is in motion. A second section of the enclosure at an exterior wall is configured with a secure access panel behind which is a storage rack that supports insertion and removal of a plurality of storage modules. In some embodiments, a third section of the enclosure can include at least one air handling unit (AHU) that operationally pulls air from a front section of the container to a rear section of the container, causing the movement of air over the IT equipment in order to convectionally remove heat generated during operation of the IT equipment.

The front wall of the container is located at a front relative to a directional movement of the container. The front wall includes at least one damper that can be placed into one or more positions ranging from a fully closed position to a fully open position to control an amount of exterior air that enters the container while the container is being moved in the aft-facing direction of the container. At least one of a rear and a lateral wall of the container includes exhaust dampers that open to release exhaust air generated by the passing of the intake air over the IT equipment to convectionally absorb and remove the heat. The configuration of the container with the intake and outflow dampers enable the use of airflow derived from vehicle velocity to pressurize the airflow ingest plenum of operational IT devices during transport of the container. According to one embodiment, a controller is programmed with a control algorithm for dynamically modulating airflow ingest and egress dampers and auxiliary AHUs to maintain a differential pressure set-point at the IT equipment inlet point that is used for cooling.

The container also includes a large air filter/evaporative medium positioned in the path of incoming air between the intake dampers and the IT equipment. The air filter/evaporative medium removes particulates and/or contaminants from the air before the filtered air impacts the exposed surfaces of the IT equipment. The air filter/evaporative medium also cools the ram air being ingested at the In one embodiment, a chemical sensor is positioned on the exterior of the intake dampers and monitors for the presence of damaging chemicals in the exterior air. The chemical sensor is coupled to a controller, which is in turn coupled to an automated gear that closes and opens the intake damper.

In one embodiment, the VC MDC includes at least one mounted seismic rack including operational vibration damping and a direct evaporative (DE) cooling subsystem to provide DE cooling of the IT equipment. The DE cooling subsystem includes a water reservoir/tank, an electric pump, and an evaporative fluid within a network of conduits for direct evaporative cooling of the IT equipment. The VC MDC further includes an on-board power supply system, including a generator electrically coupled to a power distribution unit (PDU) for providing onboard power to IT equipment during transport of the IT equipment. To allow for receipt and transfer of data in the field, the VC MDC includes a removable high density storage system for rapid transfer of data from/to the MDC to/from the edge data acquisition systems and/or to/from the centralized data center (hub).

According to one embodiment, the VC MDC also includes high-bandwidth uplink system (HBUS) for data ingestion. The HBUS is located on an exterior-surface of the container.

In one embodiment, the VC MDC is equipped with a vehicle telemetry interface for providing operational/environmental feedback from the VC MDC to the driver of the transport vehicle. Real time data provided to the driver's receiving device, or dashboard display, can include generator status, generator fuel level, evaporative cooling liquid levels, ambient temperature of the interior of the IT equipment surroundings, etc.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures (e.g. FIG. 6) and described herein may vary. For example, the illustrative components within IHS 600 (FIG. 6) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Figure 1B:
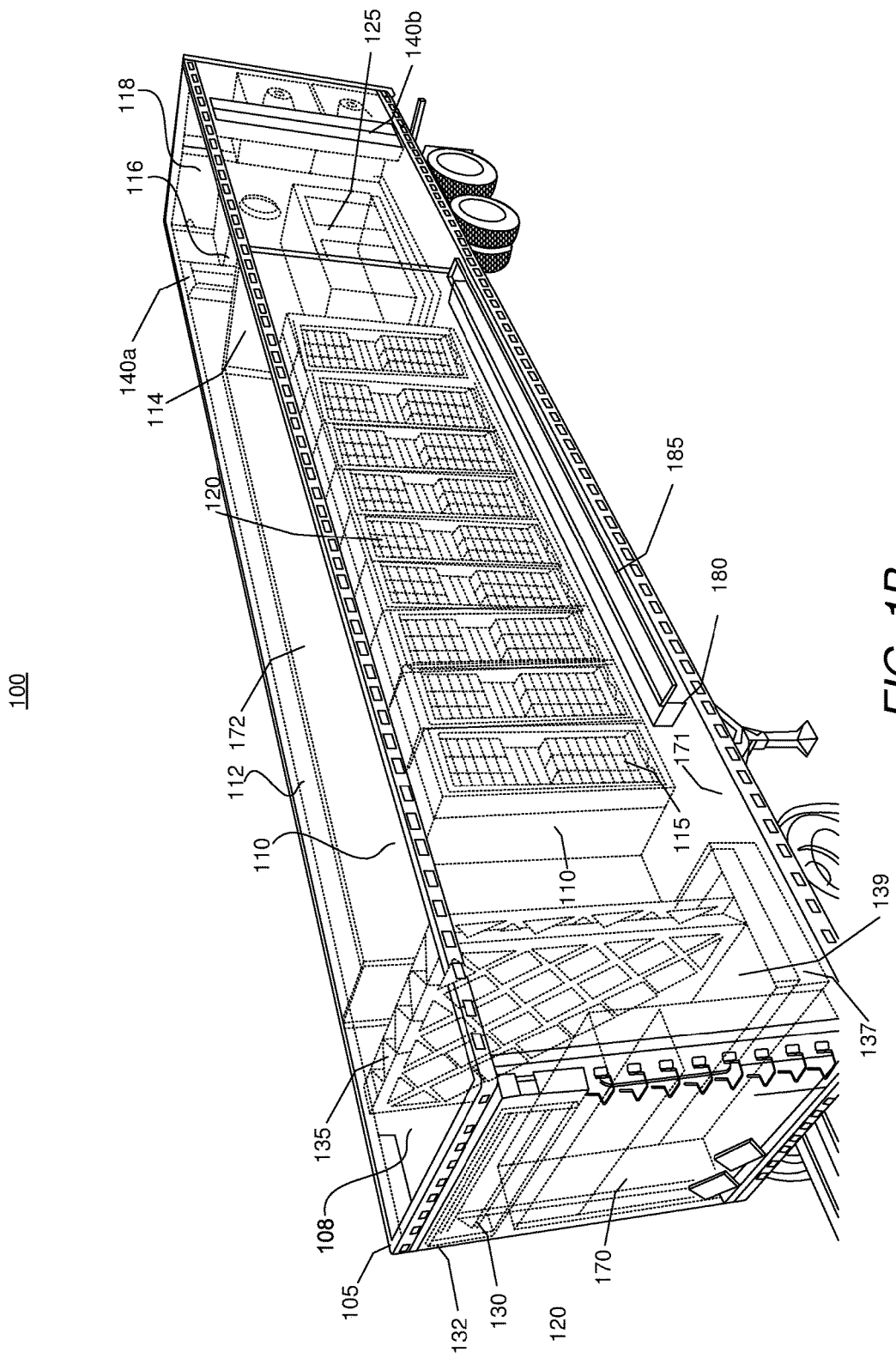
Figure 2:
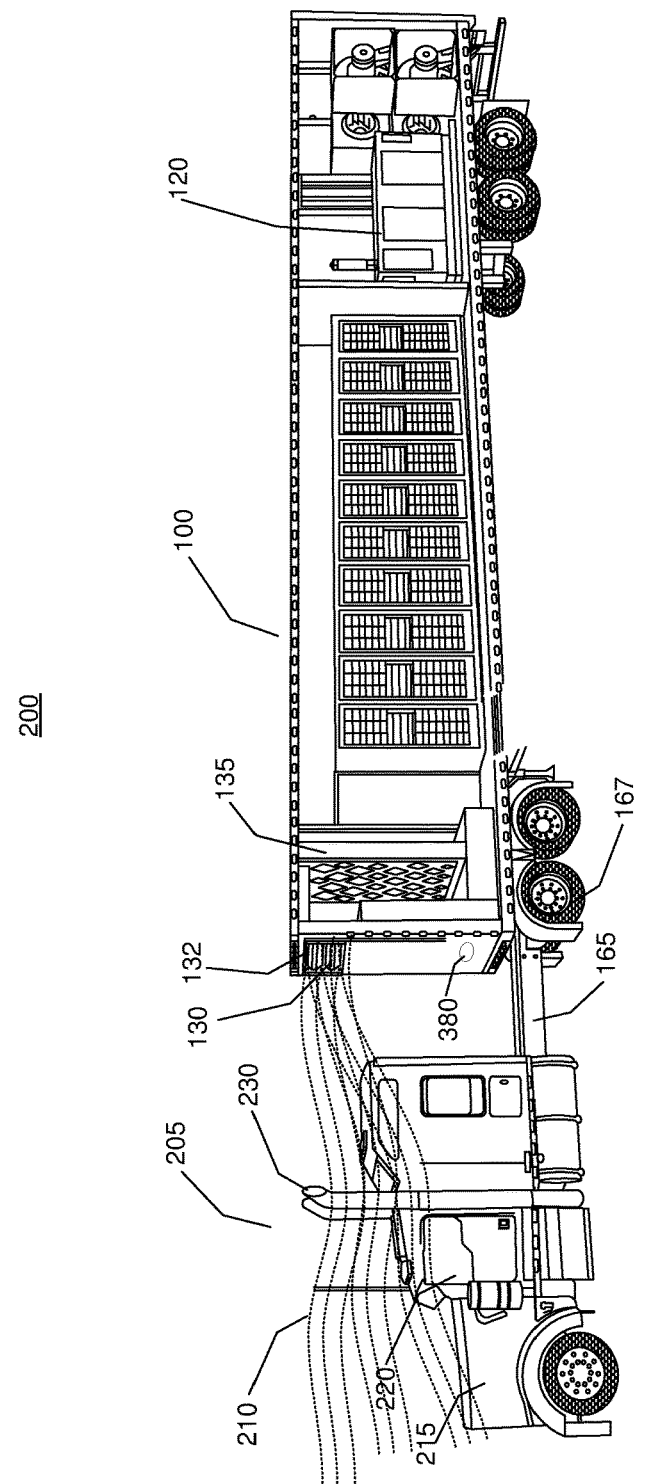
FIG. 2 is an isometric view of the VC MDC hitched to a moving vehicle that enables ingestion of outside air to provide cooling to internal information technology (IT) equipment, according to one embodiment.

With reference now to the figures, beginning with FIGS. 1A-1D and FIG. 2, there are provided block diagram illustrations of different views of an example mobile data center (MDC) configured to provide velocity-generated air-cooling to enable data processing by the MDC during data collection and transportation, according to one or more embodiments. As introduced above, the presented configuration of the velocity cooled (VC) MDC is referred to herein as VC MDC 100. The description of the different views presented by FIGS. 1A-1D and FIG. 2 are presented together, with overlapping reference across the various figures. FIG. 1A specifically illustrates a cut away side view of VC MDC 100 with a right, side panel removed, exposing the interior configuration and contents of VC MDC 100. FIG. 1B illustrates a partial side-view and front view of VC MDC 100. FIG. 1C illustrates a side view of the left side panel of VC MDC 100 with exposed air movers 150*a*, 150*b* of an air handling unit (AHU) 350 (FIG. 3) and side exhaust/egress air dampers 140*a*. FIG. 1D illustrates a rear view of VC MDC 100 with a back panel configured as dual doors with latching mechanism 192 and a security access panel 190. FIG. 2 illustrates a mobilized VC MDC 200 attached to transportation vehicle 205.

VC MDC 100 includes a volumetric enclosure 105 having a plurality of exterior walls, with first aft-facing wall/panel 170, floor 171, ceiling 172, at least one side wall/panel 174, 176, and rear panel(s) 178. Storage compartment 180 is built into one of side panels 174 and includes hinged storage compartment cover 187. The functionality associated with storage compartment 180 will be described in greater details below. The interior space of the enclosure 105 is divided up into different sections/compartments, including air intake (i.e., ram air and vehicle exhaust air ingesting (and telemetry)) compartment 108, information technology (IT) compartment 110 with structural wall/panel separator 114, cabling and exhaust air flow compartment 112, power and master controller compartment 116, and air handling unit (AHU) compartment 118.

As illustrated within FIG. 1B, at least a first section of the enclosure and a corresponding section of the floor are configured as IT compartment 110, which houses at least IT rack 115 having a plurality of IT equipment 120 thereon. Each IT rack 115 is securely affixed to floor 171 using one or more latches and connecting affordances to prevent lateral or tilting movement of IT rack 115 relative to floor 171 after IT rack 115 is secured to floor 171. Additionally, in at least one embodiment, IT rack 115 is configured or secured with at least one mounted seismic rack affordance that provides vibration damping for operational and/or movement-induced vibration.

Power and master controller compartment 116 houses on-board power supply system 125, including a generator (125) electrically coupled to one or more PDUs (125) for onboard power delivery to IT equipment. AHU compartment 118 includes two air movers 150a and 150b. In one embodiment, AHU compartment 118 can be configured with/as a direct evaporative (DE) cooling subsystem that can provide DE cooling of IT equipment 120. The DE subsystem can include a water reservoir/tank, an electric pump, and an evaporative fluid within a network of conduits for direct evaporative cooling of IT equipment 120.

Referring now to FIG. 2, which provides an isometric view of VC MDC 100 hitched to a moving vehicle (205) that enables ingestion of outside air 210 to provide cooling to internal IT equipment 120, according to one embodiment. In the illustration of FIG. 2, mobile VC MDC 200 is an 18-wheeler trailer-tractor vehicle. In the various illustrated embodiments, VC MDC 100 is illustrated as one of an iso-container or a grouping of modular sub-assembly containers placed on a wheeled trailer for transportation. VC MDC enclosure 105 is designed as a container/trailer equipped with wheels 160 and/or other affordances that enable VC MDC 100 to be moved in the forward/aft direction at a velocity that enables cooling air flow through IT compartment 110.

As presented in the descriptions herein, the direction of flow of air is in the opposite direction of the forward motion of VC MDC 100 (when VC MDC 100 is being moved). IT compartment 110 comprises at least one and potentially a plurality of heat generating IT equipment 120. In the illustrated embodiment, the at least one IT equipment 120 is provided in IT rack 115 that is securely affixed to floor 171 of IT compartment 110 via one or more fasteners or attachment affordances (not shown). Each of the one or more IT racks 115 is secured in a manner to avoid tipping or tilting and/or excessive vibration of IT equipment 120 during movement of the VC MDC 100.

In one embodiment, VC MDC 100 is configured for placement on a transportation trailer, such as a flatbed or a wheeled frame (not specifically shown) that is attached to a transportation vehicle (205). In one implementation, the transportation trailer may be a wheeled frame of a train, and VC MDC 100 is then one of the cars of the train. Referring specifically to FIG. 2, transportation vehicle 205 is presented as a truck having a cab 220 and an extended back portion or hitch 165 balanced on rear wheels 167. Hitch 165 is attached to VC MDC 100 and/or the trailer on which VC MDC 100 is attached. As shown, the extended back portion, hitch 165 of transportation vehicle 205 extends below a front section of VC MDC 100 to provide lift and attachment to VC MDC 100. Transportation vehicle 205 includes a cab 220 and a combustion engine 215 that powers the vehicle to enable forward motion. Combustion engine 215 consumes fuel and generates exhaust air which can be outputted via one or more exhaust pipes 230 extending above cab 220. Within cab 220 is a driver area that includes a seat and vehicle control affordances (e.g., steering wheel, gears shifter, fuel (gasoline or diesel) pedal, brake pedal, etc.). In one embodiment, cab 220 also includes a dashboard that includes at least one display that provides feedback about vehicle operation and motion, such as velocity. The displays can include telemetry displays, providing real-time data associated with the ambient conditions in VC MDC 100. While shown as an 18-wheeler tractor-trailer assembly comprising a truck attached to the front of VC MDC 100 that provides a pulling force to move VC MDC 100 forward, it is appreciated that other types of transportation vehicles and/or mechanisms can be utilized. The particular type of transportation vehicle can provide one of a push, pull, or levitation force that causes the forward movement of VC MDC 100. It is appreciated, that the rate of movement and/or the velocity of VC MDC 100 is directly related to the amount of push/pull force provided on the VC MDC 100 by the transportation vehicle. Additionally, while the described embodiments provide for forward movement of VC MDC 100, alternate embodiments can be provided in which the VC MDC is configured to be moved in the opposite/backward direction and or in a side/lateral direction, relative to the location of IT compartment 110 and/or IT equipment 120 within VC MDC 100. In these alternate embodiments, the location of air intake dampers and exhaust dampers would be adjusted to allow for velocity-induced air flow through IT compartment 110 while VC MDC 100 moves.

Ram Air Cooling System for VC MDC

Figure 3A:
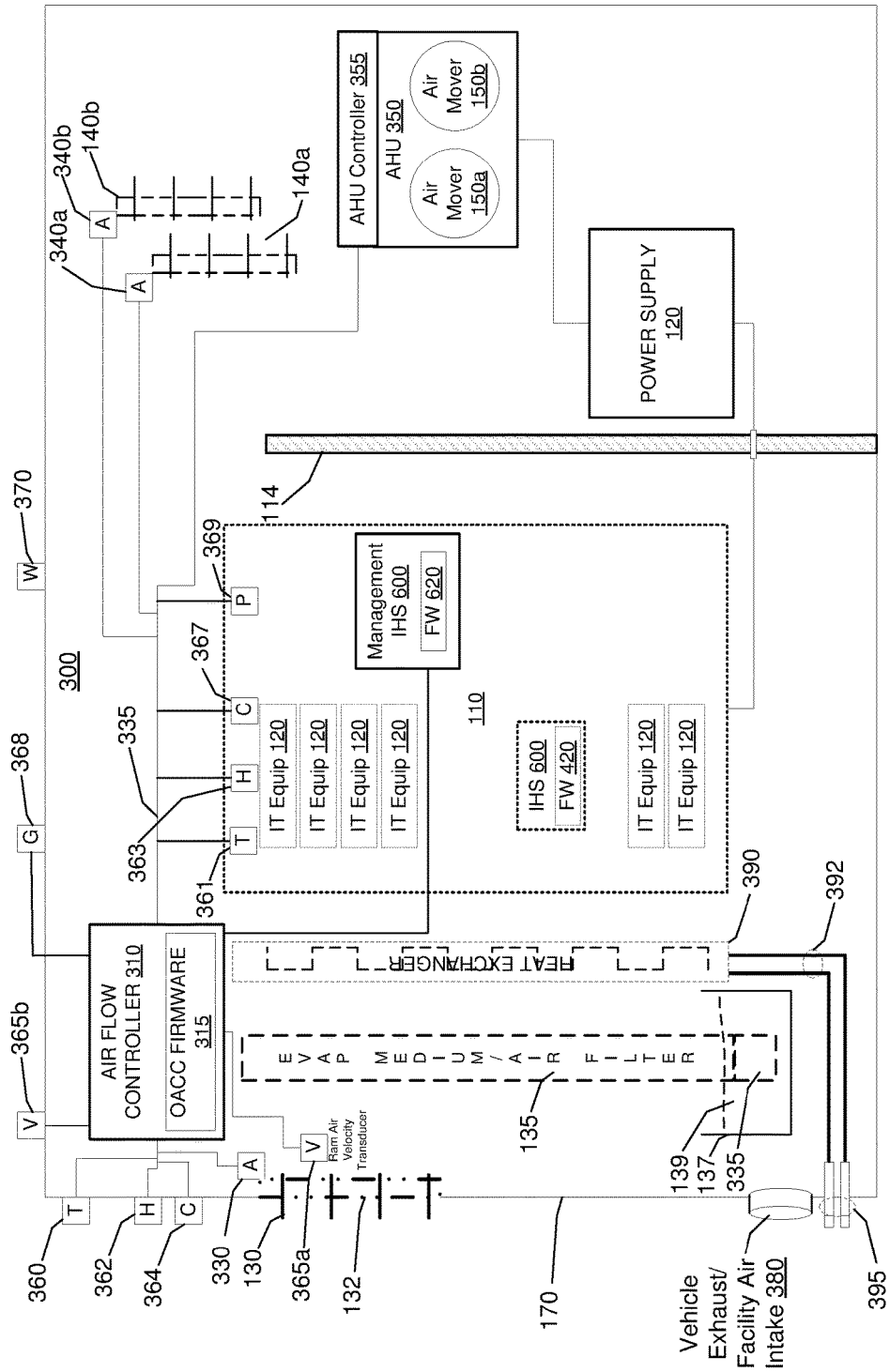
FIG. 3A is a block diagram representation of component parts of a cooling subsystem that includes an air handling unit (AHU) and which enables and/or supports internal temperature control functions of the VC MDC, in accordance with one or more embodiments.
Figure 3B:
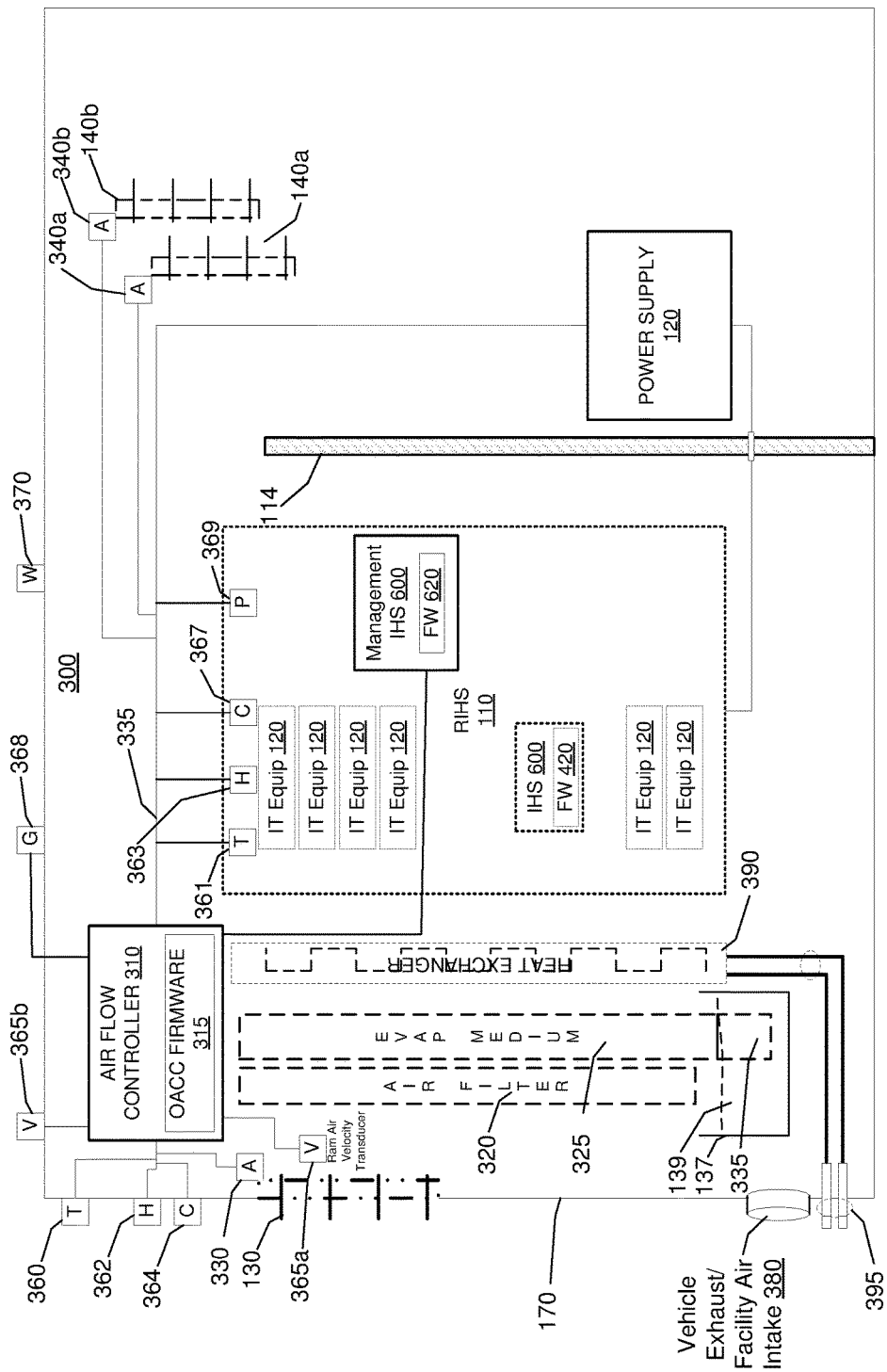
FIG. 3B is a block diagram representation of component parts of a ram air cooling subsystem that enables and/or supports internal temperature control functions of the VC MDC, without an AHU, in accordance with one or more embodiments.
Figure 4:
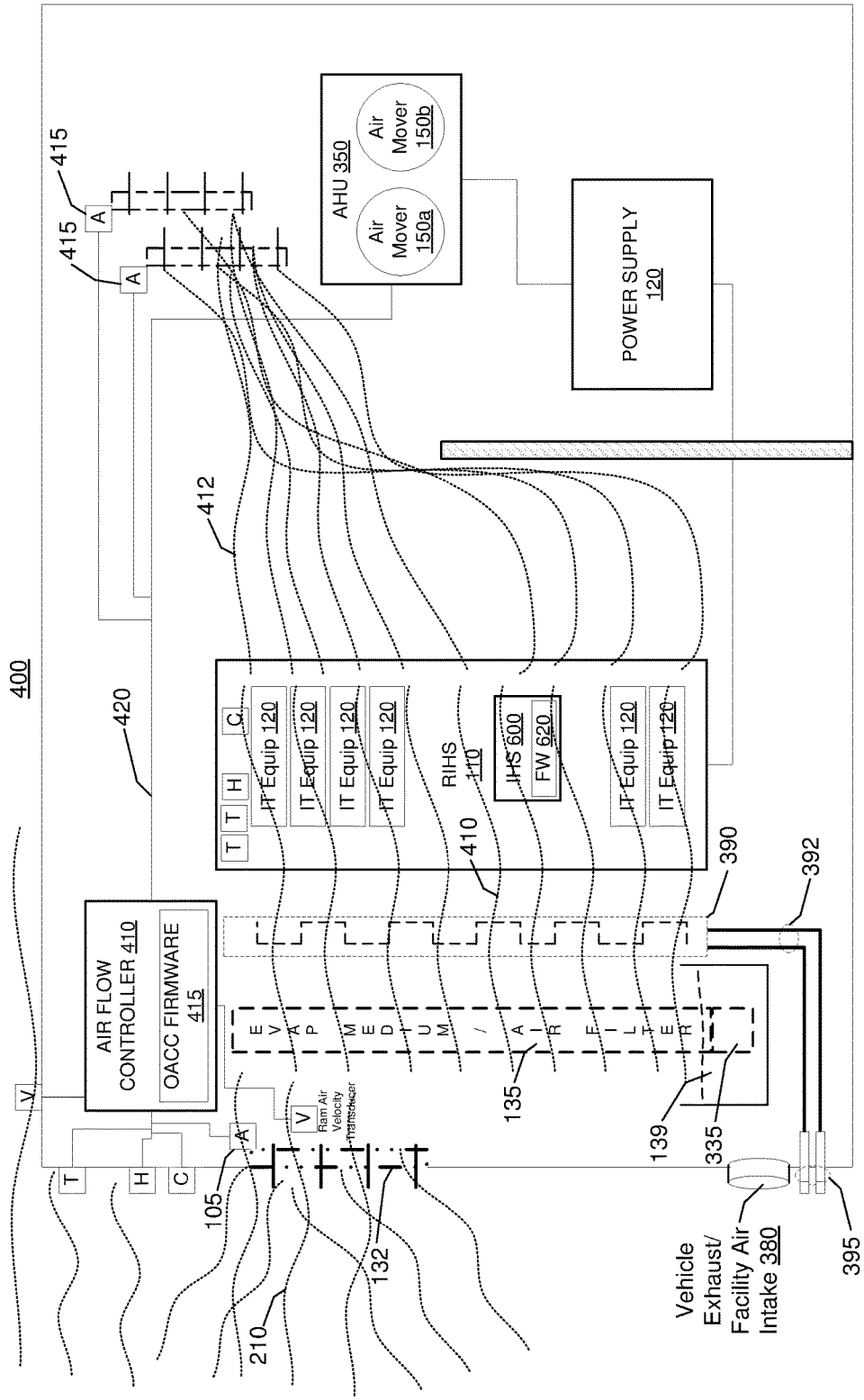
FIG. 4 is a block diagram illustrating the flow of outside air through the VC MDC utilizing selectively controlled ingest and egress dampers, in accordance with one embodiment.
Figure 5:
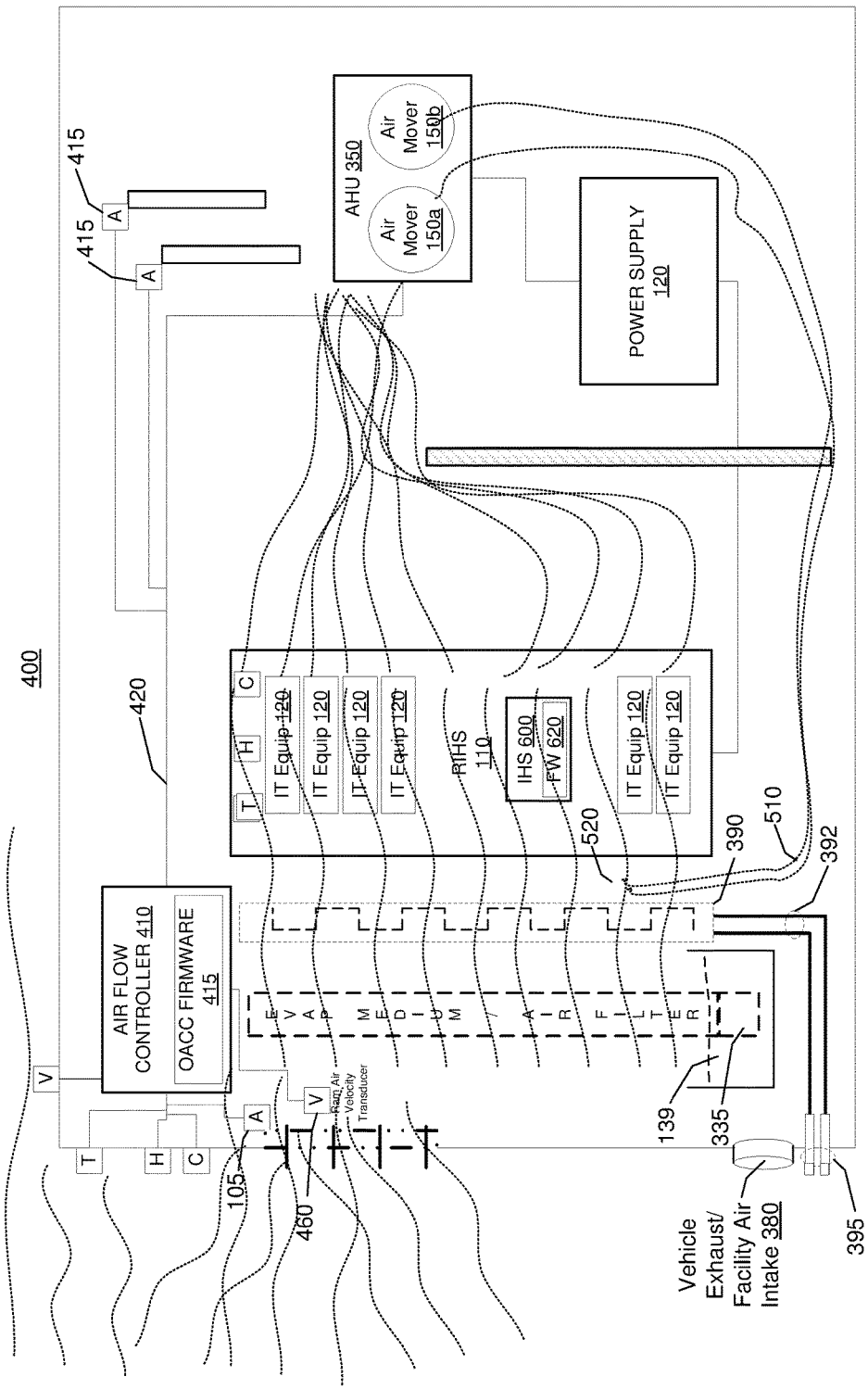
FIG. 5 is a block diagram illustrating a recirculated flow of outside air through the VC MDC utilizing selectively controlled ingest and egress dampers and an air handling unit (AHU), in accordance with one embodiment.

Referring now to FIGS. 3A-B, 4, and 5 with continuing reference to FIGS. 1A-1D and FIG. 2. FIGS. 3A and B are block diagram representations of component parts of a cooling subsystem that enable and/or support VC cooling and/or internal temperature control functions of VC MDC 100, in accordance with one or more embodiments. The cooling subsystem of FIG. 3A includes AHU 350 as a secondary cooling source, while the cooling subsystem of FIG. 3B does not. FIG. 4 is a block diagram representation of the movement of outside cooling air within cooling system of VC MDC 100, with the airflow being selectively controlled utilizing ingest and egress dampers, according to one or more embodiments. FIG. 5 is a block diagram representation of the movement of cooling/heating air within VC MDC 100 with a recirculation path introduced utilizing AHU 350, in accordance with one embodiment;

As provided by FIG. 3A, VC MDC 100 includes ram air velocity-controlled cooling subsystem (VCCS) 300 that provides cooling to the at least one IT equipment 120 within IT compartment 110. Operation of the various processes provided by the VCCS 300 is controlled by air flow controller 310, which is configured with outside air cooling control (OACC) firmware 315. OACC firmware 315 includes a plurality of set points, data, and cooling algorithms that enable air flow controller 310 to perform the various cooling functions based on the velocity of travel and the amount, characteristics, and quality of ingested outside air, as described herein. Additionally, as illustrated within FIG. 3, VCCS 300 includes and/or is communicatively connected to management information handling system (IHS) 600. While shown as a separate component from air flow controller 310, it is appreciated that air flow controller 310 can be an extension of, or a module executed within, management IHS 600. The component make-up and functionality provided by management IHS 600 will be described below.

VCCS 300 includes an air inlet/ingress/intake opening 132 with outside air intake damper 130 configured within the aft-facing wall 170 of the enclosure/container (105). In one embodiment, outside air intake damper 130 is configured with an actuator 131, which enables intake damper 130 to be selectively moved/positioned in one of a plurality of external air intake positions, ranging between a fully-opened position and a fully-closed position. Actuator 330 is communicatively coupled to air flow controller 310. The actuator-provided open/close setting of the intake damper, while the container/trailer is being moved in the aft-facing direction, determines the amount of exterior air that enters enclosure (105) at the ingress opening 132. The forward velocity of the container/trailer creates an inflow of outside air. The rate the inflow of outside air enters the trailer is, in part, controlled by and/or correlated to the velocity of the container/trailer movement and/or the velocity at which the transportation vehicle is moving.

VCCS 300 also includes air flow controller 310 communicatively coupled to the motor of the motorized front damper 130 and to velocity sensor 365a, 365b that detects the velocity of at least one of: (a) a directional flow of ambient air moving from the outside into the interior of the enclosure (105) to impact and provide cooling for the heat-generating IT equipment 120; and (b) a movement of the transportation trailer on which the enclosure (105) is affixed for transportation. Air flow controller 310 provides operational control of the cooling air intake damper 130 to place damper 130 in a specific open position based on the detected velocity, thereby controlling an amount of cooling air allowed to enter into the enclosure (100). Consequently, VC MDC 100 is able to maintain the IT equipment within a desired operational range of temperatures.

As one aspect of the disclosure, characteristics associated with the outside air are required to be sensed and communicated to airflow controller 310. These sensed characteristics of the air enable airflow controller 310 to perform calculations to determine an amount of outside air to ingest into VC MDC 100 and the amount of exhaust air to expel from VC MDC 100. As shown, VCCS 300 includes temperature sensors 360, humidity sensors 362, chemical sensors 364, velocity sensors 365a, 365b, each of which are communicatively coupled to airflow controller 310. These sensors detect a respective one of the outside air temperature, the outside air humidity, chemical composition of the air, the velocity of the outside air or relative velocity based on the detection of the movement of the container.

Additionally, VCCS 300 also includes internal sensors, of which second temperature sensor 361, second humidity sensor 363, second chemical sensor 367, and pressure sensor 369 are illustrated. Internal sensors provide ambient conditions of the air inside of IT compartment 110, which is utilized by airflow controller 310 and/or management IHS 600 to modulate and/or adjust one or more characteristics related to the outside air being ingested into the container. Internal temperature sensor 361 provides the actual ambient temperature of the IT equipment. Airflow controller 310 compares the actual ambient temperature to a range of temperature values between highest operating temperature threshold and lowest operating temperature threshold to ensure IT equipment 120 is operating in an ideal range of temperature. External chemical sensor 364 identifies when the chemical composition of the ingested air is not conducive (or potentially harmful) to the IT equipment 120. Air flow controller 310 responds to sensing/detecting these conditions by: (i) closing the intake dampers; and (ii) signaling the management IHS 600 to throttle the IT equipment; and/or (iii) resorting to secondary cooling, such as using AHU and/or DE cooling, if available. Pressure sensor 369 provides an internal pressure reading that air flow controller 310 utilizes to control the open/close position/ setting of ingress damper 130 and egress dampers 140a, 140b to ensure the internal pressure is maintained below a pressure threshold value.

Air flow controller 310 is communicatively coupled to GPS receiver 368 and/or to wireless transceiver 370, which allow air flow controller 310 to track the location of VC MDC 100. GPS receiver 368 and/or wireless transceiver 370 provide location based information that can correlate to road conditions that affect the velocity of travel of VC MDC 100. These conditions can include, but are not limited to time of day of travel, presence of stop lights, posted speed limits on particular roadways, and occurrence of accidents causing traffic delays or congestion, etc. Air flow controller 310 utilizes information about the traffic and road conditions and associated mapping of the roadways and geographical areas to plan for changes in velocity that can affect availability of outside air cooling for IT equipment 120 operation. In one embodiment, the various sensors can be implemented as one or more transducers, which provides a specific level of electrical signal to airflow controller 310, which signal level correlates to a specific value of the measured component of the outside air. In one embodiment, OACC firmware 315 includes several data sets that enable airflow controller to accurately determine the temperature, humidity, and velocity, of the outside air.

In the illustrated embodiment, two different velocity values are sensed/recorded by respective velocity sensors 365a, 365b, which can be velocity-sensing transducers, and are therefore also referred to herein as velocity transducers 365a, 365b. According to one aspect of the disclosure, the actual velocity of the air entering the chamber of VC MDC 100 as measured by velocity transducer 365a, will be different from the outside air velocity measured by second velocity transducer 365b due, in part, to the presence of ram air effects. According to one embodiment, the small aperture provided by air intake opening 132 (FIG. 1A, 2B) presents an air intake design that utilizes dynamic air pressure created by the vehicle motion to increase the static air pressure inside of VC MDC 100. With this "ram air" cooling, the velocity of the air (i.e., the flow rate) being ingested is increased due to the small sized opening 132 which the larger mass of exterior air is made to pass through when the intake dampers 130 are open. Thus, the amount of cooling air available and the velocity of that air may be magnitudes greater, respectively, than the amount of air that would normally impinge on the area of air intake opening 132 and the velocity of the transport vehicle and/or outside air, as measured by the exterior velocity sensor 365b. As a result, cooling of IT equipment can be achieved without secondary sources of cooling while the vehicle is moving at a relatively low velocity, e.g., 30 mph.

In the illustrative embodiments of FIGS. 1A, 1B, 2, and 3A, VCCS 300 also includes a combination evaporative medium and air filter (evap. medium/air filter 135) that is positioned in an ingress path of incoming air 210 between the intake damper 130 and the IT compartment 110 with at least one IT equipment 120. Air filter component of evap. medium/air filter 135 removes particulates and/or contaminants from the air 210 before a resulting filtered air comes into contact with exposed surfaces of the at least one IT equipment 120. While shown as a single large air filter, it is appreciated that the filtering of the outside air can be completed by different sizes and configurations of air filters, without limitation. In one embodiment, air filter 135 can include a chemical filter to remove harmful chemicals from the air before the year is allowed to be passed into IT compartment 110. The integrated evaporative medium of evap. medium/air filter 135 has a first (bottom) end 335 extended into sump container 137 that is filled with a cooling liquid 139, such as water.

FIG. 3B presents an alternate embodiment in which VCCS includes a separate air filter 320 and evaporative medium 325, both positioned in an ingress path of the incoming flow of cooling air between the air intake opening and the at least one IT equipment. As with the above combination implementation, air filter 320 removes particulates and contaminants from the cooling air before a resulting filtered, ingress air is passed through evaporative medium 325. Evaporative medium 325 includes a wicker-like material that absorbs liquid and has one end extended 335 into sump container 137 which includes cooling liquid 139, such as water. The cooling liquid is absorbed by the wicker material and permeates the evaporative medium 325. The liquid-permeated/absorbed evaporative medium 325 provides cooling to the ingested ram air as the air passes through the liquid-absorbed evaporative medium.

FIGS. 3A and 3B also present a liquid-to-air (LTA) heat exchanger (HE) subsystem, which includes LTA HE 390 coupled via intake and outflow conduits 392 to external connectors 395. The application of LTA HE subsystem to provide cooling or heating of the ingested air will be described later within the descriptions of FIGS. 7 and 15.

As shown by FIGS. 4 and 5, outside air 210 enters through front opening 132 of the enclosure (105) at a first velocity V1, as measured by exterior velocity sensor 365b. Airflow controller 310 receives data related to characteristics of outside air 210 from each of the plurality of sensors (360-365). It is appreciated that these sensors can be implemented as transducers that provide an electrical signal relative to the measured telemetry values, respectively. Outside air 210 passes through evap. medium/air filter 135 to provide filtered, cooled air 410, which flows through IT compartment 110 (at a cold aisle side of IT equipment), contacting and convectionally removing heat from IT equipment 120. Heated air, hereinafter referred to as IT exhaust air or simply exhaust air 412, exits from IT equipment 120 (at the hot aisle side of IT equipment). The terms cold aisle and hot aisle are known to those skilled in the art of modular data centers. According to one embodiment, and as illustrated in FIGS. 4 and 5, IT exhaust air 412 travels/or is routed along a particular path away from IT compartment 110 towards the rear of the container. Partition wall 114 represents the division/separation between IT compartment 110 and a back portion of the container. To provide additional cooling to ingress air, evap. medium/air filter 135 has a first end extended into sump container 137, which includes a cooling liquid 139, such as water.

VCCS 300 also includes exhaust/egress air control damper 140a, 140b positioned within at least one of the side facing walls 174, 176 and the rear facing wall or rear panel 178. It is appreciated that exhaust air damper can be located in ceiling 172 or other location that is downstream of IT compartment 110. Exhaust air control damper 140a, 140b opens to release exhaust air, which is the outside air ingested into IT compartment 110 and heated while passing over/through the heat generating IT equipment 120. According to one embodiment, the intake air convectionally absorbs and removes heat being dissipated by the IT equipment, and the heated exhaust air can then be made to egress/exit the container via the egress damper(s) 140a, 140b. As described later, in some situations as illustrated by FIG. 5, some or all of IT exhaust air 510 is recirculated within the IT compartment 110, based on specific conditions detected by VCCS 300 within at least one of the outside air and IT compartment 110. Recirculated IT exhaust air 510 is channeled back to cold aisle 520 of IT compartment 110, and is reused as cooling air flow to cool and/or heat IT equipment 120. Similar to intake damper 130, in one or more embodiments, each exhaust air egress damper 140a, 140b is configured with actuator 340a, 340b, which enables egress damper 140a, 140b to be selectively moved/positioned in one of a plurality of exhaust air expelling positions, ranging between a fully-opened position and a fully-closed position. Airflow controller 310 is thus able to control both the rate at which outside air is allowed to be ingested into VC MDC 100, and how much of the ingested air that becomes exhaust air should be expelled from VC MDC 100 to effectuate the right balance of airflow, pressure, humidity, and temperature conditions within IT compartment 110.

According to one embodiment, to support operations of IT equipment 120 during periods of low velocity movement or when the transport vehicle is not moving, VCCS 300 further includes at least one AHU 350 having an AHU controller 355. AHU 350 includes at least one air movers 150a, 150b, such as a motorized electrical fan. When a signal is received from airflow controller 310, AHU controller 355 sets AHU 350 to provide a specific amount of rotational velocity for the air movers to generate an appropriate flow of cooling air within IT compartment 110. At least one embodiment, AHU controller 355 is triggered to provide cooling air IT equipment to supplement and/or replace the reduced flow of outside air into VC MDC 100. Additionally, as described in greater detail below, VCCS controller 310 communicates with management IHS 600, which controls the processing and power functions of IT equipment. The various components within VC MDC 100 receive electrical power from onboard power supply 125, also referred to as power supply system (which is inclusive of PDU). The amount of power available from power supply system 125 to supply all of the components within VC MDC 100 is capped at a predetermined amount of power. As such, the availability of power for IT equipment 120 processing is reduced whenever AHU 350 is required to provide cooling, because AHU 350 is drawing the required energy from power supply system 125. It is appreciated that AHU 350 represents one type of mechanical cooling, among other available types than can be presented in different embodiments. Further, while a secondary mechanical source of cooling is provided within the example VCCS 300, it is appreciated that in one or more alternate embodiments, no such secondary cooling systems are provided. With these alternate embodiments, only velocity based cooling is available and IT equipment 120 is throttled and/or placed in sleep mode whenever the transport vehicle stops moving at a sufficient velocity to support the cooling of IT equipment 120 using only the outside air (i.e., ram air cooling).

In an alternate embodiment, indicated by FIG. 3B, VC MDC 100 does not include an AHU or other auxiliary cooling system and instead relies solely on velocity-generated ram air cooling of the IT equipment 120 during vehicle mobility. Additionally, VC MDC 100 relies on external cooling options (e.g., external AHUs) when VC MDC 100 is stationary, such as when parked at a docking facility (see FIG. 7). With this embodiment, operation of the IT equipment is throttled or paused whenever the transport vehicle goes into a parked, non-moving or slow moving mode (i.e., low velocity). As the velocity of the vehicle increases, the level of processing then increases, up to a maximum allowable processing level. The amount of processing provided by IT equipment 120 takes into consideration the amount of available power and the heat removal efficiency of VCCS 300 with the ingested ram air at the current velocity or future velocity, as predicted by airflow controller 310 or management IHS 600.

Figure 6:
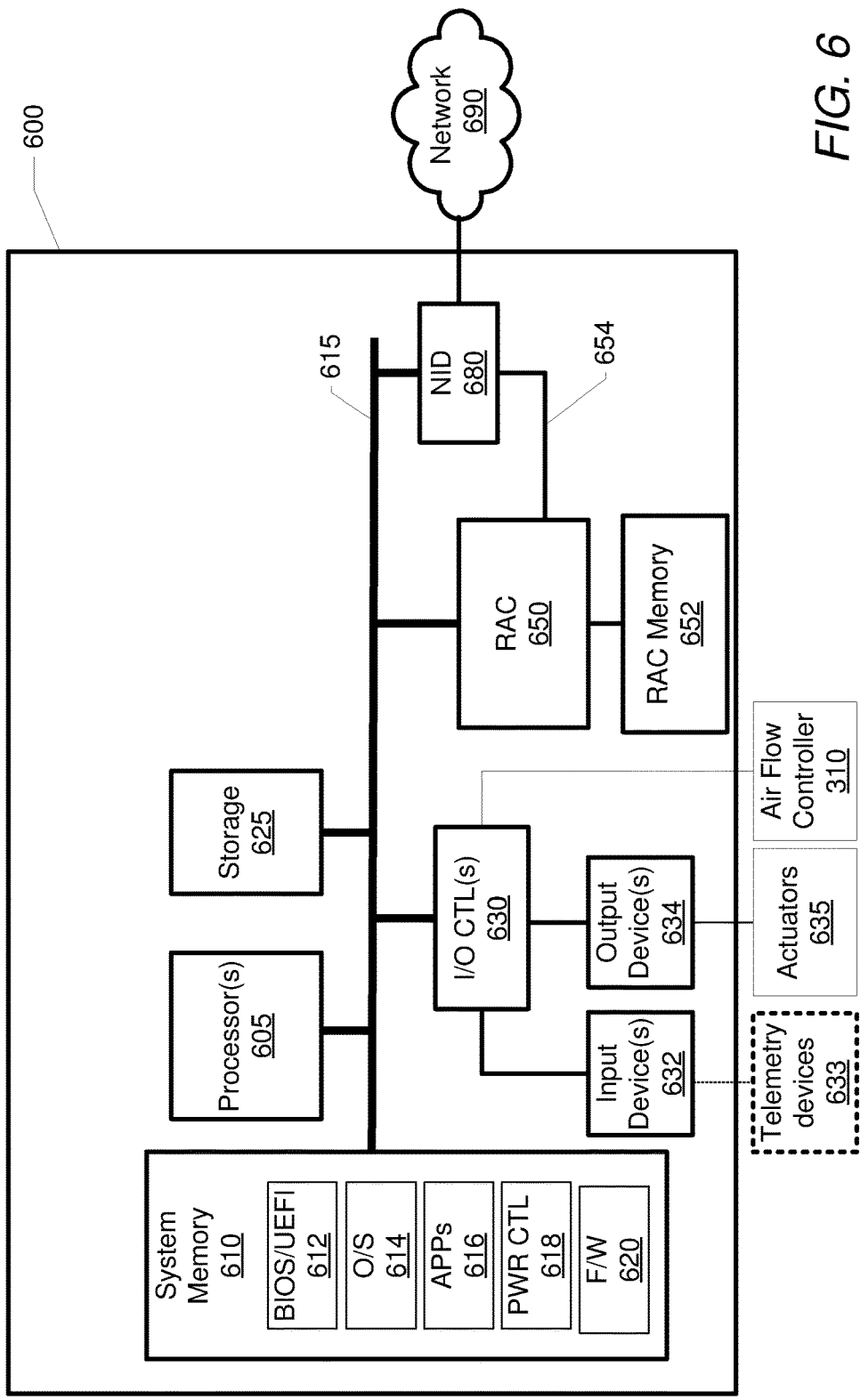
FIG. 6 is a block diagram representation of functional components of a management IHS of a VC MDC, according to one or more embodiments.

Referring now to FIG. 6, there is illustrated an example management IHS 600. Management IHS 600 performs the management functions that control a host of MDC processes including an amount and level/rate of processing performed by IT equipment 120, power capping and power distribution/allocation, data ingestion and usage during transportation, temperature control with VCCS 300, and other functions on board VC MDC 100. While shown as a separate module/component within IT compartment 110, is appreciated that management IHS 600 (i.e. the functionality provided by management IHS 600) can be provided by one or more components of IT equipment 120 within IT rack 115. It is further appreciated that all of the above functionality attributed to airflow controller 310 can be implemented as and executable module within management IHS 600. In this embodiment, the telemetry data from the various sensors would be provided to management IHS 600, and management IHS would then execute management firmware 620 to trigger the implementation of certain responsive processes and operations within VC MDC. For example, management IHS 600 would trigger transmission of the appropriate control signals to intake actuator 105 to set the open/close position of ingress/intake damper 130 in order to control an amount of outside air that enters VC MDC 100.

For purposes of this disclosure, an information handling system, such as IHS 600, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 6, management IHS 600 includes one or more processor(s) 605 coupled to system memory 610 via system interconnect 615. System interconnect 615 can be interchangeably referred to as a system bus, in one or more embodiments. Also coupled to system interconnect 615 is storage 625 within which can be stored one or more software and/or firmware modules and/or data (not specifically shown). In one embodiment, storage 625 can be hard drive or a solid-state drive. The one or more software and/or firmware modules within storage 625 can be loaded into system memory 610 during operation of management IHS 600. As shown, system memory 610 can include therein a plurality of software and/or firmware modules including basic input/output system (BIOS) 612, operating system (O/S) 614, application(s) 616, power control module 618, and firmware (F/W) 620.

In one or more embodiments, BIOS 612 comprises additional functionality associated with unified extensible firmware interface (UEFI), and is thus illustrated as and can be more completely referred to as BIOS/UEFI in these embodiments. The various software and/or firmware modules have varying functionality when their corresponding program code is executed by processor(s) 605 or other processing devices within IHS 600.

Figure 7:
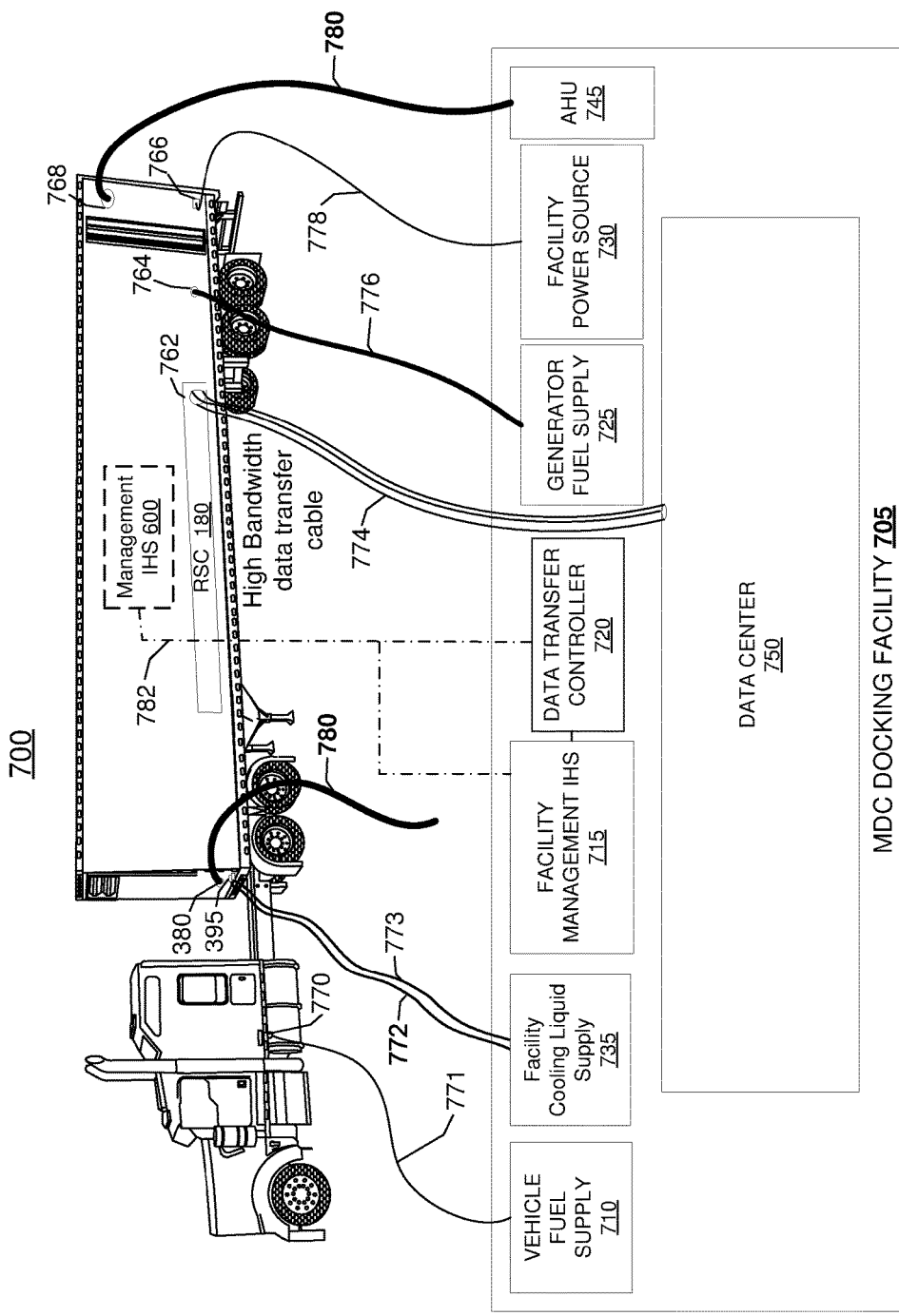
FIG. 7 is a block diagram representation of a docking environment including VC MDC and a docking facility and/or data center, according to one or more embodiments.

Power control module 618 provides a series of control algorithms that determine which components of IT equipment 120 receives power, the amount of power allocated to IT equipment 120 and other components within VC MDC 100, and other processes related to the use and/or allocation of the limited amounts of power within VC MDC 100. In one embodiment power control module 618 is incorporated within firmware 620 during transportation of VC MDC 100. Firmware 620 is a collective name utilized herein to reference the collection of various control modules and algorithms that are executed by management IHS 600 to enable and/or support operation of VC MDC 100 during transportation and docking cycles thereof. The term docking cycle refers to a period when VC MDC 100 is stationary at one or more locations at which VC MDC 100 connects with a data consumer or a data supplier. FIG. 7, described below, illustrates an example period during the data processing cycle in which VC MDC 100 is stationary (i.e., not moving to generate ram air effects for cooling) at a docking location.

Referring again to FIG. 6, management IHS 600 further includes one or more input/output (I/O) controllers 630 which support connection by, and processing of signals from, one or more connected input device(s) 632, such as a keyboard, mouse, touch screen, or microphone. Additionally, in one embodiment, input devices further include telemetry sensors/devices 633, such as those presented in FIG. 3. As previously stated, management IHS 600 can provide the functionality of air flow controller 310 as one of the modules within firmware 620. Alternatively, management IHS 600 can be communicatively coupled to air flow controller 310.

I/O controllers 630 also support connection to and forwarding of output signals to one or more connected output devices 634, such as a monitor or display device or audio speaker(s). Additionally, when management IHS 600 assumes/performs the role of air flow controller 310, management IHS 600 is also communicatively connected to actuators (generally actuators 635) for intake damper 130 and egress dampers 140a, 140b.

Additionally, in one or more embodiments, management IHS 600 includes a remote access controller (RAC) 650. RAC 650 is in communication with processor(s) 605 and system memory 610 via system interconnect 615. RAC 650 provides management functions that allow a remotely connected administrator to deploy, monitor, manage, configure, update, troubleshoot and remediate management IHS 600. RAC 650 is also coupled to, or includes, RAC memory 652. RAC 650 is also communicatively coupled to one or more network interface devices (NID) 680 via a sideband bus 654.

RAC 650 can monitor and control the operation of management IHS 600 and other systems and devices communicatively coupled to IHS 600. RAC 650 can also perform configuration and remote control of other connected IHSs. Certain software and/or firmware modules stored in RAC memory 652 can be executed by RAC 650. RAC 650/RAC memory 652 includes specific firmware that enables RAC 650 to perform various functions described herein. RAC 650 can contain components that control specific operations of IHS 600 such as power and thermal management. In one embodiment, RAC 650 can monitor and record the instantaneous and average power usage of IHS 600 and provide power data to other IHSs and computers.

IHS 600 further comprises NID 680 that is communicatively coupled to system interconnect 615. NID 680 enables IHS 600 to communicate and/or interface with other devices, services, and components that are located external to IHS 600. These devices, services, and components can interface with IHS 600 via an external network, such as example network 690, using one or more communication protocols. Network 690 can be a local area network, wide area network, personal area network, and the like, and the connection to and/or between network and IHS 600 can be wired or wireless or a combination thereof. It is appreciated that while VC MDC 100 is mobile, the connection to network 690 would be for a wireless medium. NID 680 is therefore assumed to incorporate a wireless antenna and transmission system within and/or coupled to management IHS 600. FIG. 3 provides an example wireless transceiver 370 that can provide the wireless connectivity for VC MDC 100 and management IHS 600. For purposes of discussion, network 690 is indicated as a single collective component for simplicity. However, it is appreciated that network 690 can comprise one or more direct connections to other devices as well as a more complex set of interconnections as can exist within a wide area network, such as the Internet.

Turning now to FIG. 7, there is illustrated an example docking environment 700 where VC MDC 100 is docked at (i.e., in a stationary position and not generating ram air for cooling) and interfaced/connected with components and/or services provide by MDC docking facility 710. As presented herein, MDC docking facility 705 can be or can include data center 750 that consumes data provided by VC MDC 100, as further described below with respect to FIG. 20. In the illustrated embodiment, MDC docking facility 705 also includes vehicle fuel supply 710, management IHS 715, coupled to and/or included in data transfer controller 720, generator fuel supply 725, facility power source 730, facility cooling liquid supply 735, and facility AHU 745. In order for VC MDC 100 to support connection to and or by the various components of MDC docking facility 705 (as presented within docking environment 700), VC MDC 100 is configured with a plurality of connecting or receiving affordances. These affordances include vehicle fuel tank 770, secondary air intake 380, cooling liquid external connectors 395, data transfer port 762, generator fuel tank 764, external power plug-in receptacle 766, and AHU cooling air intake 768. It is appreciated that the exact location of these various affordances can vary from configuration and/or design of each VC MDC 100, and that not all of the affordances are required and/or are present in some embodiments of VC MDCs. Further, it is appreciated that the docking facility 705 can, in alternate embodiments, be designed with less or more support services/components than illustrated, with the primary service being access to an external cooling source (745).

FIG. 7 further illustrates example connectivity between each component of docking facility 705 with corresponding affordances on VC MDC 100/200. The illustrated connecting components include fuel hoses 771 and 776, facility cooling fluid intake and outflow conduits 772, 773, cooling air intake conduit 780, high-bandwidth data transfer cable 774, and power supply conduit 778. The respective functionality of each of these connecting components can be determined based on the components within docking facility 705 to which they are coupled. FIG. 7 illustrates that AHU 745 can be connected to VC MDC 100 at different locations to provide cooling air into VC MDC 100. Facility cooling liquid supply 735 (e.g., cold water) can also be pumped into VC MDC through intake and outflow conduits 772, 773 to provide cooling via LTA HE 390 (FIG. 3A) With the availability of cooling air provided while VC MDC 100 is docked and/or stationary, IT equipment 120 within VC MDC receives the necessary cooling that enables IT equipment 120 to continue processing operations in the absence of the ram air cooling that would otherwise be provided during forward movement of VC MDC above a minimum threshold velocity.

Notably, high-bandwidth data transfer cable 774 enables the offloading of large amounts of data stored on storage modules within RSC 180. The transfer of data, and the amount of cooling air provided, and the amount of processing operations allowed to be performed by IT equipment 120 are controlled by communication between management IHS 600 and facility management IHS 715 and/or data transfer controller 720. A communication link 782 is first established between management IHS 600 and facility management IHS 715 to enable efficient data transfer and throttled IT equipment operations during the time VC MDC 100 is docked at docking facility 705.

Figure 9A:
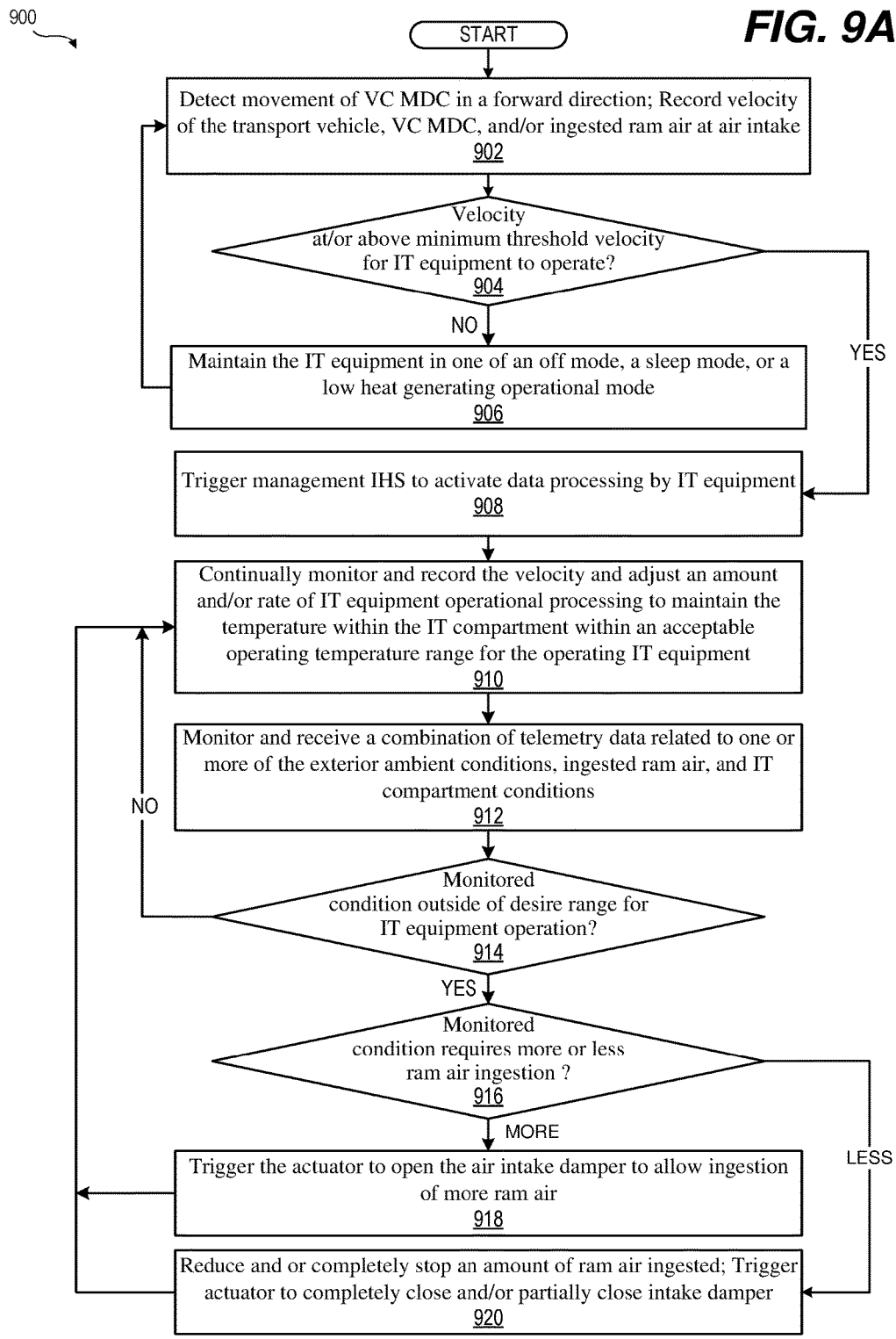
FIG. 9A is a flow chart illustrating one example of the method for providing VC cooling that enables VC MDC to provide data processing while moving in the field, according to one or more embodiments.
Figure 9B:
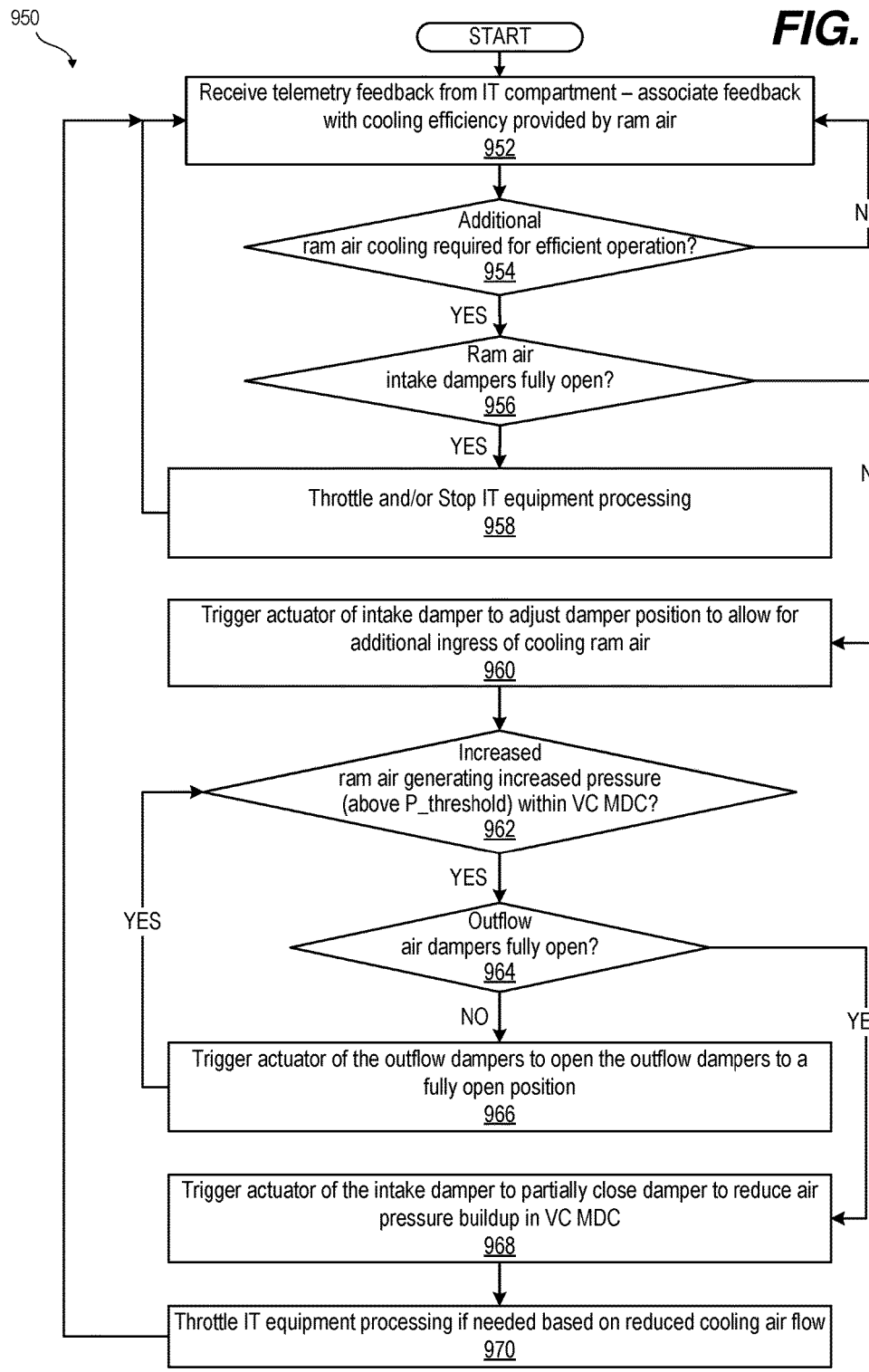
FIG. 9B is a flow chart illustrating one example of the method for controlling an amount of VC cooling air allowed to flow through VC MDC, based on control of one or more dampers, according to one or more embodiments.

FIGS. 8, 9A and 9B illustrate flowcharts of exemplary methods related to the provisioning of a VC MDC 100 and the utilization of the functionality provided by VC MDC, as introduced within the preceding figures to perform different aspects of the processes that enable the one or more embodiments of the disclosure. Specifically, FIG. 8 illustrates one example of the method for provisioning or manufacturing a mobile MDC with velocity-based ram air cooling functionality. FIG. 9A illustrates one example of the method for providing cooling of operating IT equipment within an MDC using velocity-based flow of outside air, according to one or more embodiments. FIG. 9B illustrates one example of the method by which outside air cooling of the MDC is supplemented during period of low velocity and or parking/docking of the VC MDC 100, according to one or more embodiments. The description of methods 800, 900 and 950 are provided with general and continuing reference to the specific components illustrated within the preceding FIGS. 1-7.

Turning now to FIG. 8, a method for provisioning a VC MDC is provided. Method 800 is generally described as being performed during manufacturing of mobile MDC in an original equipment manufacturer (OEM) manufacturing process having a control IHS that connects to and controls one or more automated devices and processes. Method 800 includes providing a volumetric container having exterior walls and a closed interior space configured with at least one interior IT compartment for hosting one or more IT equipment (block 802). Method 800 also includes configuring within a first aft-facing wall a ram air intake opening with at least one intake damper that can selectively be moved between an open and close position to open, partially open and fully closed the air intake opening (block 804). At block 804, method further includes configuring the at least one intake damper with an actuator and, at block 805, method 800 includes providing an airflow controller and communicatively coupling the air flow controller to the actuator to enable selective positioning of the at least one damper into a specific open/close position to control an amount of ram air introduced into the container. Method 800 includes configuring within a second wall at least one egress damper that allows exhaust air to exit the container (VC MDC 100) (block 806). Method 800 further includes installing a plurality of telemetry sensors capable of sensing one or more environmental conditions from among temperature, pressure, humidity, and air velocity within one or more of the IT compartment, the air ingestion section of the VC MDC, and an exterior of the VC MDC (block 808). Method includes communicatively coupling the air flow controller to each of the plurality of telemetry sensors (block 810). Method 800 further includes configuring the airflow controller with OACC firmware to enable control of an amount of RAM air introduced into VC MDC (block 810). In one embodiment, method 800 further includes providing an air filter in an air ingestion section of the VC MDC between the at least one intake opening and the IT compartment to filter intake ram air prior to forwarding the intake ram air to the IT compartment (block 812). Method 800 includes placing at least one heat generating IT equipment within the IT compartment that requires a source of cooling air to operate (block 814). Method 800 also includes providing a power source, and a management IHS that supports operation of the at least one IT equipment during movement of the VC MDC, and connecting the IT equipment to the power source (block 816). Method 800 can also optionally include providing an air mover, such as AHU, within an AHU compartment of the VC MDC (block 816). Method 800 also includes providing a management IHS that monitors and supports operation of the at least one IT equipment during movement of the VC MDC (block 818). The management IHS communicates with an air flow controller to provide cooling air flow utilizing ram air that is ingested based on a velocity of movement of the VC MDC. Method 800 further includes communicatively coupling the management IHS to the air flow controller and the IT equipment (block 820). Method 800 then ends.

In one embodiment, method 800 also optionally includes equipping the container with physical affordances that enable forward movement of the trailer along a motorized travel path; and affixing connection affordances to the trailer for connecting to a motorized engine that enables the forward movement of the trailer. The movement can be via at least one of a pull, push, levitation, or other force applied to/against the trailer, and the supported movement is at a velocity sufficient to provide enough cooling airflow through the container to minimize use of the AHUs in cooling the IT equipment.

In one embodiment, method 800 further includes attaching a transport vehicle to MDC. The transport vehicle includes a combustion engine, and one or more movement affordances, such as wheels (surface wheels or rail wheels), wings, etc., that enable the transport vehicle to move at a high enough velocity to generate ram air capable of cooling the operating IT equipment. In one embodiment, method 800 also optionally includes configuring the transport vehicle to support VC MDC. In this embodiment, method 800 includes providing a vehicle telemetry interface that provides operational/environmental feedback from the VC MDC to a driver of a transport vehicle attached to the VC MDC. The interface provides real time data to a receiving device of the driver and/or the transport vehicle (e.g., display within the dashboard). The real-time date can include at least one of a generator status, a generator fuel level, evaporative cooling liquid levels, and ambient temperature of the interior of the IT equipment surroundings. Additionally, as described in greater detail with respect to FIG. 14A-14C, method 800 can include providing an exhaust air intake opening with a connection affordance that supports coupling of a vehicle engine exhaust conduit to VC MDC. With this embodiment, method further includes configuring VC MDC to selectively route exhaust air from the vehicle engine into the exhaust conduit and away from an engine exhaust pipe.

Referring now to FIGS. 9A and 9B, generally, methods 900 and 950 represent computer-implemented methods. Method 900 is described as being implemented via air flow controller 310 (via its internal processor unit) and particularly the execution of code provided by OACC firmware 315 within air flow controller 310. Method 950 is described as being implemented via management IHS 600 (via its internal processor) and particularly the execution of code provided by management firmware 620. It is however appreciated that certain aspects of the described methods may be implemented via other processing devices or a combination of processing devices and/or execution of other code within VC MDC. Alternatively, one on one aspect of the method may be provided via remote operational control of a network connected management IHS (not specifically shown).

Large Scale, Scalable Data Processing During VC MDC Movement

With specific reference to FIG. 9A, method 900 begins at the start block and proceeds to block 902 where air intake controller 310 of vehicle-attached VC MDC 200 detects movement of VC MDC 100 and an aft/forward direction. At block 902, Method 900 also includes air intake controller 310 recording a velocity of at least one of transport vehicle, VC MDC, and ingested ram air at intake opening 132. Method 900 includes air intake controller 310 determining at block 904 whether the measured, determined, or received velocity is at or above a minimum threshold velocity required to provide a first amount of cooling air to IT equipment that will allow IT equipment to operate within VC MDC. In response to the velocity not being at or above the minimum threshold velocity required for IT equipment operation, method 900 includes maintaining the IT equipment in one of an off mode, a sleep mode or a low heat generating operational mode (block 906). In response to the velocity being at or above the minimum threshold velocity to support ram-air cooling of the IT equipment, air intake controller 310 triggers management IHS 600 to activate processing by one or more IT equipment 115 (block 908). Method 900 further includes continually monitoring and recording a velocity of one or more of the recordable velocities (block 910), and triggering the management IHS 600 to adjust an amount and/or rate of IT equipment operational processing to maintain the temperature within the IT compartment within an acceptable operating temperature range for the operating IT equipment (block 910).

According to one embodiment, in response to detecting (block 910) the velocity of the vehicle falling below the minimum threshold velocity, method 900 includes transmitting (block 910) a throttle/sleep signal to management IHS to throttle and/or stop processing operations by the IT equipment that would increase the temperature of the IT component and/or within IT compartment, while there is no ram air available or less than the required minimum amount of ram air available to maintain the IT equipment in the desired operating temperature range.

At block 912, method 900 includes monitoring and/or receiving a combination of telemetry data related to one or more of the exterior ambient conditions, ingested ram air, and IT compartment conditions. Method includes determining at block 914 whether any of the monitored conditions, based on the received telemetry data, falls outside of a desired range for that specific data type. For example, telemetry data related to outside humidity or chemical composition of the outside air may make the outside air not suitable for use in cooling the IT equipment. When no other form of air cooling is available within VC MDC, detection of this scenario requires air intake controller 310 to adjust the amount of velocity based ram air that is allowed to enter into VC MDC, in order to protect the IT equipment. In response to none of the monitored conditions being outside of a respective desired range, method 900 cycles back to block 910. In response to one or more of the telemetry data being outside of the desired range, method 900 includes determining, at block 916, whether the identified condition requires more ram air (e.g., IT equipment operating temperatures approaching or above max temperature threshold) or less ram air (e.g., chemical composition or temperature of ram air potentially harmful to IT equipment). In response to the condition requiring more ram air, method 900 includes triggering the actuator to open the air intake damper to allow ingestion of more ram air into the VC MDC (block 918). In response to the condition requiring less ram air, method includes triggering an actuator of the intake damper to close and/or partially close the intake damper, reducing and or completely stopping an amount of ram air permitted to enter into VC MDC (block 920). Method 900 cycles back to block 910.

Referring now to FIG. 9B, method 950 begins at start block and then proceeds to block 952 which provides receiving telemetry feedback from IT compartment of an efficiency of the cooling being provided by ram air. Method 950 includes identifying (at decision block 954) whether additional ram air cooling is required to maintain a current operational level of IT equipment. In response to determining that additional cooling air is required, method 950 includes determining, at block 956, whether the ram air intake dampers are fully open. If the dampers are already in a fully opened position, method 950 includes throttling and/or stopping processing by the IT equipment to prevent damage to the IT equipment and/or to reduce consumption of power to operate mechanical air handlers (block 958). In response to identifying that additional ram air cooling is required while the intake damper is not fully open (and while the outside air conditions are conducive to utilizing the outside air for additional cooling), method 950 includes intake air controller (air flow controller 310) triggering the actuator of the intake damper to adjust a damper position to allow for additional ingress of cooling ram air into VC MDC (960).

Method 950 proceeds to block 962, at which a determination is made whether the increased ram air cooling is creating an increased pressure inside of VC MDC, above a pressure threshold. In response to determine that the increased ram air cooling is creating an increased pressure, method includes identifying at block 964 whether the outflow/egress air dampers are fully opened. In response to determining that the outflow dampers are not fully open, while there is an increase in pressure within VC MDC, method 950 includes triggering the actuator of the outflow dampers to open the outflow dampers to a fully open position (block 966). However, in response to the outflow dampers being fully opened while there is a buildup in pressure within VC MDC, method 950 includes throttling an amount of intake ram air ingested by triggering the actuator to reduce the open position of the intake damper (block 968). Concurrently, or in response to throttling the amount of intake ram air being ingested, method 950 may also include throttling the amount of processing by the IT equipment based on the reduced cooling air flow (block 970).

According to one embodiment, method 950 includes ingesting ram air at a first ingestion point (132) of VC MDC 100, the ram air being generated from outside air passing through the ingestion point at an increased velocity correlated to a moving velocity of VC MDC 100 and or the transport vehicle moving VC MDC 100. Method 950 further includes filtering the ingested ram air to remove particulates and contaminants. Method 950 includes forwarding/routing the filtered ingested ram air to a cold aisle of an IT compartment 110 having at least one heat generating IT equipment 120 operating therein. Method 950 further includes enabling the filtered ingested ram air to convectionally absorb heat generated by the at least one heat generating IT equipment 120 and produce exhaust air at a hot aisle of IT compartment 110. Method includes passing the exhaust air through at least one egress damper 140a, 140b out to an exterior of the VC MDC 100.

With the above described methods 900 and 950, VC MDC 100 can be equipped with fan-less IT equipment that are cooled by pressurization from the vehicular motion during transport, and then cooled by site-powered AHUs while VC MDC 100 is docked at the MDC docking facility. Each of the above methods take advantage of air motion induced by vehicular velocity to drive airflow through IT equipment 120. The aft-facing wall is the leading edge of the mobile MDC trailer and include the intake damper(s) (130). The velocity of the vehicle provides high pressure air into the intake dampers, and the air ultimately flows into the cold aisle of the IT compartment and over the IT equipment to provided cooling thereof.

Figure 10A:
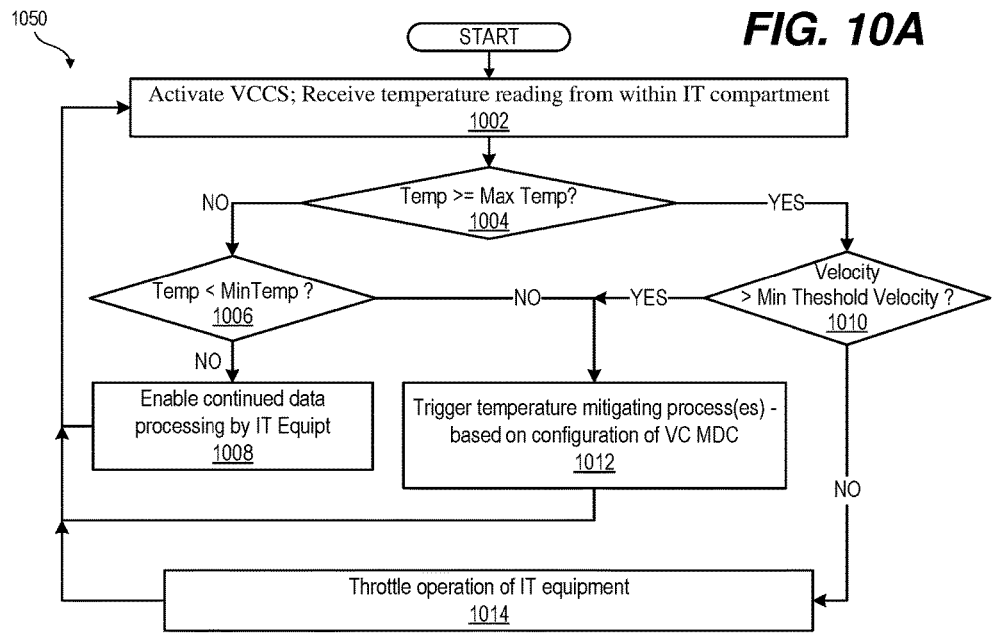
FIG. 10A is a flow chart illustrating the method of enabling large-scale data computation by a MDC during MDC transportation, according to one or more embodiments.
Figure 10B:
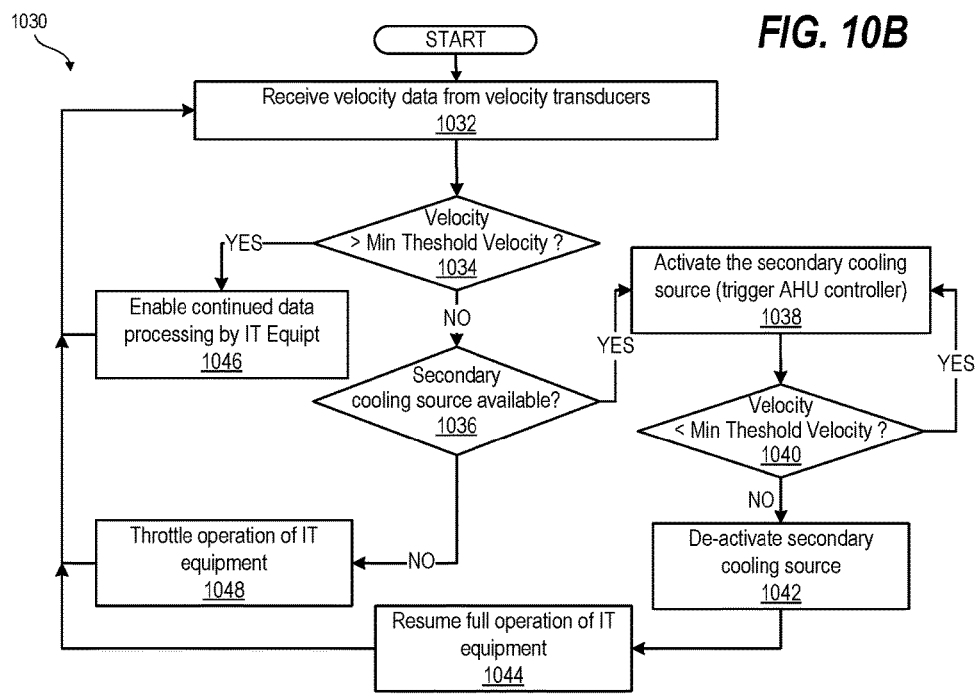
FIG. 10B is a flow chart illustrating the method of facilitating cooling of the IT equipment utilizing a supplemental AHU to support large scale data operations during MDC transportation, according to one or more embodiments.

One key aspect of the disclosure, involves the use of VC MDC 100 to provide/enable processing of data on a large scale while the VC MDC 100 is moving in the field. Aspects of this mobile processing environment is provided within the flowcharts of FIGS. 10A-10B. Specifically, FIG. 10A illustrates one example of the method for providing VC cooling to enable the VC MDC 100 to provide data processing while moving in the field, according to one or more embodiments. FIG. 10B further illustrates one example of the method by which the cooling operations supported by the MDC is completed utilizing a combination of VC cooling and AHU operation, according to one or more embodiments. Method 1000 is described as being implemented via management IHS 600 (via its internal processor) and particularly the execution of code provided by management firmware 620.

Method 1000 begins at start block and proceeds to block 1002 with management IHS receiving, from temperature sensor/transducer a temperature reading identifying a current temperature within the IT compartment. Method 1000 includes comparing the current temperature reading to a range of acceptable operating temperatures of the IT equipment and determining at block 1004 whether the temperature is at or above the maximum acceptable temperature for IT equipment processing. In response to the temperature being below the maximum acceptable temperature for IT equipment processing, method 1000 further includes determining at block 1006 whether the temperature is below the minimum acceptable temperature for IT equipment processing.

In response to the temperature being within the range of acceptable temperatures (i.e., current measured/sensed temperature is above the minimum acceptable temperature and below the maximum acceptable temperature), method 1000 includes enabling IT equipment to continue operating and processing of data (block 1008). In response to the temperature being above the maximum acceptable operating temperature, method 1000 includes identifying whether the VC MDC is moving at a high enough velocity (i.e., at or above the threshold minimum velocity) to support ram air cooling of the operating IT equipment (block 1010). In response to determining at block 1010 that the VC MDC is moving at a sufficiently high velocity to support ram air cooling of the operating IT equipment, while the temperature remains above the maximum threshold velocity, method 1000 includes triggering one or more temperature mitigating processes (block 1012). If the velocity is not greater than the minimum threshold velocity, method 1000 then includes throttling the operation of the IT equipment unless a separate cooling air supply is provided (block 1014). Then method returns to block 1002.

Figure 13:
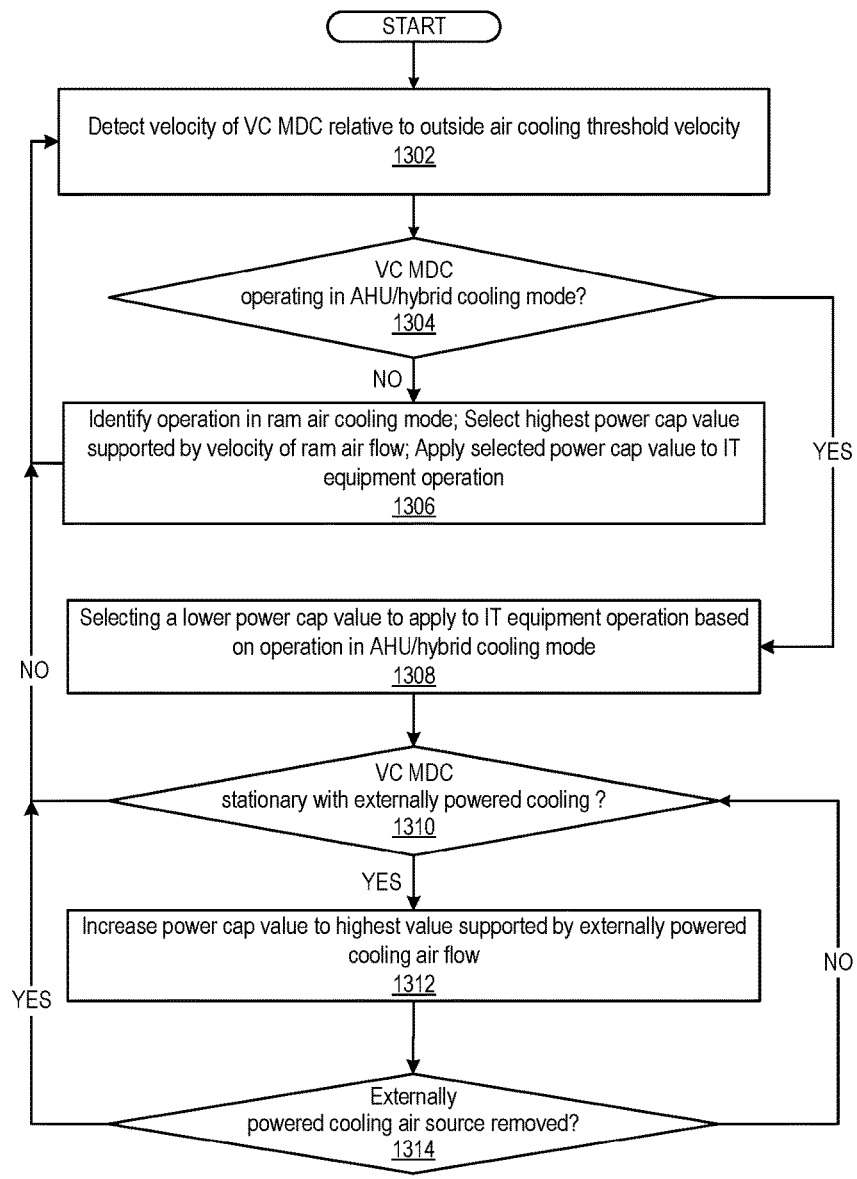
FIG. 13 provides a flow chart illustrating the method for implementing power capping to conserve available onboard power for IT equipment processing, based on availability of ram air cooling to support heat removal from the operating IT equipment, according to one or more embodiments.

The temperature mitigating processes include processes covered by one or more of FIGS. 9B, 10B, and 13. As an initial process, method 1000 involves performing the steps of blocks 956-960 (FIG. 9). These steps include identifying whether the air intake damper is fully open and, in response to the air intake damper not been fully open, signaling the airflow controller to open the air intake damper to allow more ram air to be ingested into VC MDC. However, once these processes are completed, and the air intake damper is fully open, method 1000 can be expanded further to include the processes provided by FIGS. 10B and 10C These processes are performed while the temperature within IT compartment 110 remains at/or above the desired maximum operating temperature.

Bypass System for Modulating AHU VS Ram-Air Based Upon Vehicular Velocity

Turning to FIG. 10B, there is illustrated an example extension of method 1000 in which VC MDC includes at least one internal AHU. FIG. 10B thus provides a method for selectively providing cooling to operating IT equipment in a VC MDC equipped with at least one an air handling unit (AHU). Method 1030 of FIG. 10B begins at block 1022 with management IHS receiving velocity data from one or more velocity transducers. Method 1030 then includes identifying/determining whether the VC MDC is moving at or above the minimum threshold velocity to support ram air cooling of the operating IT equipment (block 1034). If the measured velocity is at or above the threshold minimum velocity, method 1030 includes continuing to support data processing by the IT equipment (block 1046). In response to determining at block 1034 that the VC MDC is not moving at or above the threshold minimum velocity, method 1000 then includes identifying whether there is a secondary cooling source available (block 1036) and activating any secondary cooling source, such as onboard AHU (block 1038). In one embodiment, the activation includes triggering the AHU controller to activate a fan to generate cooling air flow (block 1038). Accordingly, management IHS augments IT cooling utilizing AHU air movers when VC MDC is moving at low speeds. Method 1030 also includes continually checking the velocity reading to determine if the velocity remains below the minimum threshold velocity (block 1040). In response to the velocity no longer being below the minimum threshold velocity, method 1030 includes deactivating the secondary cooling source (block 1042) and resuming the full operation of the IT equipment (block 1044). At decision block 1036, if there is no secondary cooling source, then method 1030 includes throttling the operation of the IT equipment (block 1048). Additionally, management IHS throttles an amount of mechanical air circulation being generated as the velocity of the VC MDC increases until the ram air being ingested is able to provide 100% of the required cooling air flow.

According to one or more embodiments, method 1030 is further expanded to include management IHS identifying other potential situations that require use of an available supplemental cooling source, such as the AHU, to supplement or replace ram air cooling. Among the possible scenarios in which supplemental cooling is required, without limitation, detecting that the VC MDC stationary, detecting that the VC MDC moving velocity is not sufficient to generate the ram air needed to cool the IT equipment, identifying that the ingested ram air at fully open mode is not sufficient to cool the IT equipment, receiving a signal indicating that the air intake damper needs to be closed to protect the IT equipment (e.g., harmful chemical composition of the outside air or temperature above or below the operational range that can cause damage to the IT equipment). Method 1030 would then include triggering the AHU controller to turn on the AHU fans to generate movement of circulating cooling air. Method 1030 would further include monitoring the internal temperature of the IT compartment and controlling an amount of cooling air circulation provided by AHU, based on the amount of cooling ram air being ingested by VC MDC.

Figure 10C:
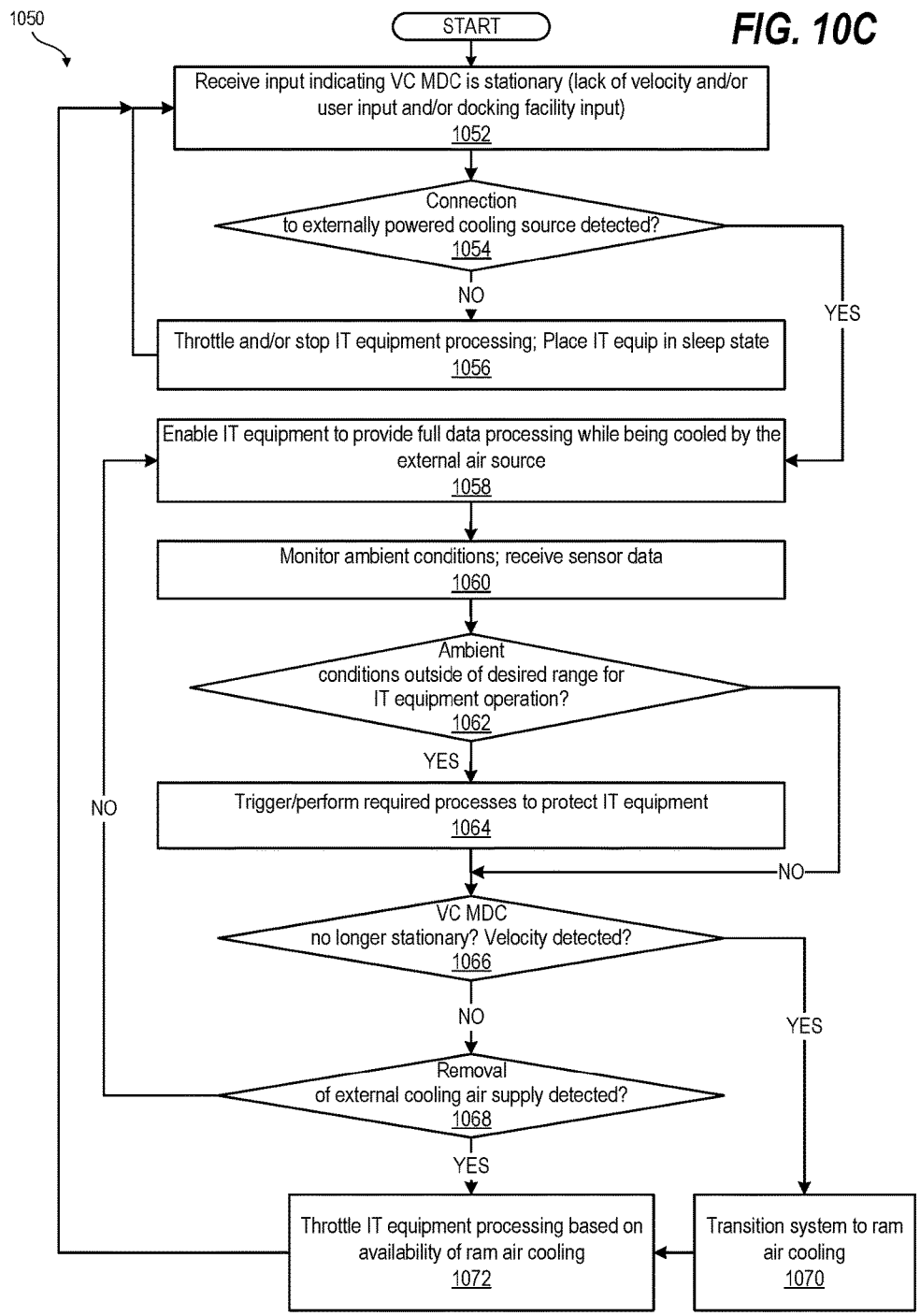
FIG. 10C is a flow chart illustrating a method for providing cooling of the IT equipment using a supplemental air cooler, such as an externally located AHU, while the VC MDC is stationary, in accordance with one or more embodiments.

FIG. 10C provides a method that includes use of a supplemental air cooler, such as an externally located AHU, while the VC MDC is stationary. Method 1050 begins at block 1052, at which management IHS receives an input that indicates that VC MDC is stationary (not moving) and/or is docked at an MDC facility. It is appreciated that the specific input can be simply the loss of velocity at specific geographical locations or an actual input received from a user, such as the driver of the transport vehicle or personnel at the docking facility. At block 1054, method 1050 includes identifying whether VC MDC is connected to an externally powered AHU (i.e., an onboard AHU that is connected to an external power source or an external AHU providing a supply of cooling air). In the embodiment where VC MDC is at the docking facility, management IHS 600 determines/detects via one or more sensors whether an external air source has been coupled to VC MDC to provide cooling air to the IT equipment. In response to not detecting connection of an external air source, management IHS 600 maintains/places the IT equipment in a sleep state and/or low operational state that does not require the external air source to provide cooling (block 1056). However, in response to detecting connection of the external air source, management IHS 600 enables IT equipment to provide full data processing while being cooled by the external air source (block 1058). Concurrently, management IHS 600 initiates monitoring of the ambient conditions (e.g., temperature, humidity, and pressure) within IT compartment (block 1060). Management IHS 600 then determines whether any one of the monitored conditions falls outside of a desired range for operation of IT equipment (decision block 1062). In response to any one of the monitored conditions being outside of the respective desired range, management IHS 600 performs one or more processes to protect the IT equipment (block 1064). According to one or more embodiments, these processes can include at least one of (i) throttling or halting/pausing the operation of the IT equipment (e.g., when the sensed temperature value is not within the desired range), (ii) modulating an open/close position of the exhaust dampers (e.g., when the pressure value approaches or exceeds a maximum pressure threshold), and (iii) signaling the controller of the external air source to modify the composition and/or characteristics of the provided cooling air (e.g., adjusting the temperature to manage the humidity in order to avoid condensation on the IT equipment).

Method 1050 further includes determining at block 1066 whether VC MDC is moving (i.e. no longer stationary). In response of VC MDC no longer being stationary, method 1050 includes transitioning the cooling of the IT equipment over to ram air cooling controlled by airflow controller (block 1070). In response to VC MDC being stationary, method 1050 continues to block 1068. At decision block 1068, method 1050 includes determining whether removal of the externally powered cooling air source is detected. In response to detecting removal of the externally powered cooling air source and concurrently with transition the system to ram air cooling (block 1070), method 1050 includes throttling and/or temporarily stopping operation of the IT equipment based on the availability of ram air cooling (block 1072). Method 1050 returns to block 1052.

Velocity-Based Power Capping

Figure 11:
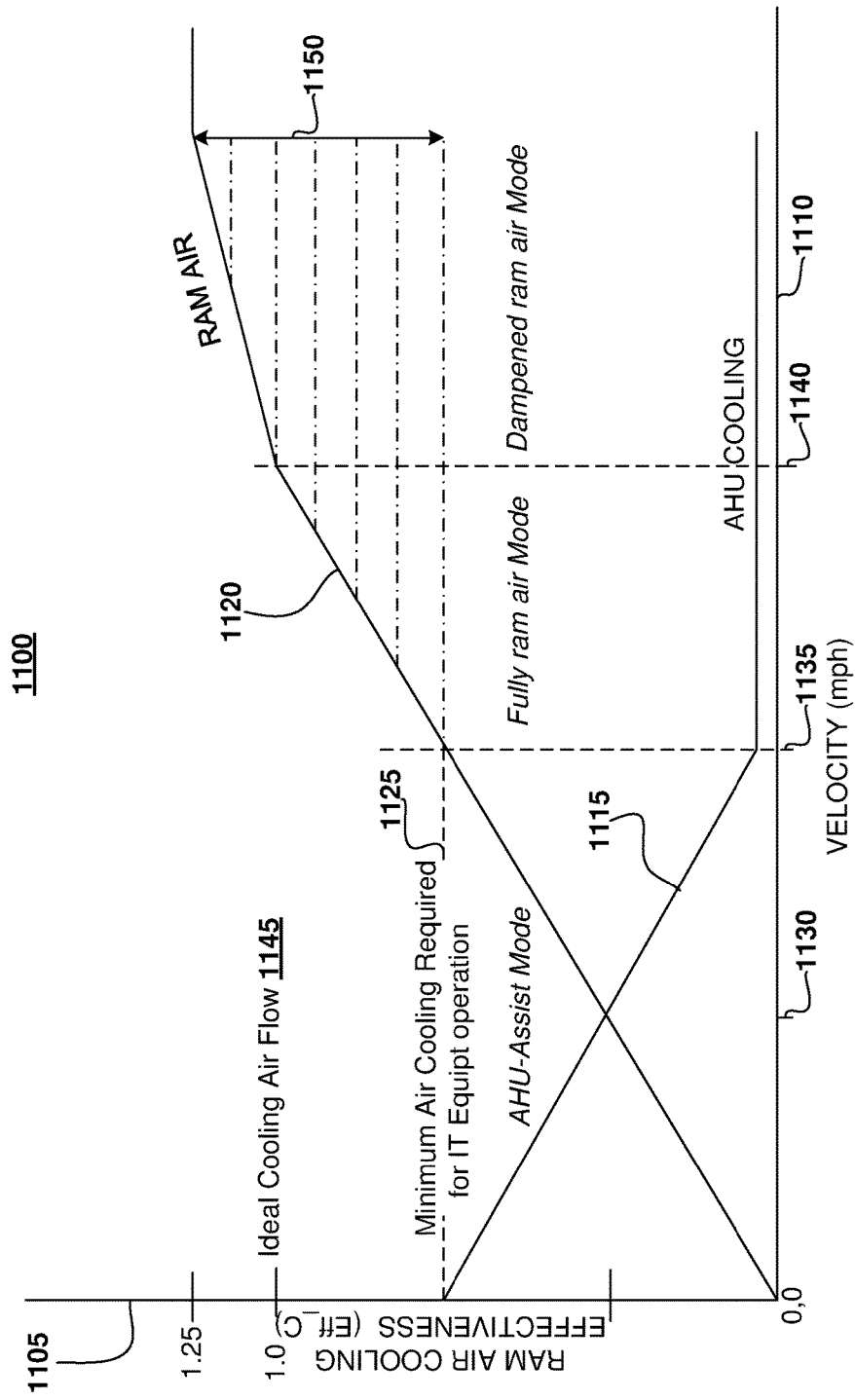
FIG. 11 is a chart illustrating the transition from power consuming AHU cooling to ram air cooling as the velocity of the VC MDC increases, according to one or more embodiments.

While the VC MDC is processing during transport, the velocity of the transport will be dynamically impacted by traffic conditions, speed limits, and other road conditions. During periods of low velocity, the amount of "vehicle provided" cooling will be diminished and the necessity for supplementary air movers will increase. FIG. 11 is a chart illustrating the transition from power consuming AHU cooling to ram air cooling as the velocity of the VC MDC increases, according to one or more embodiments. Velocity chart 1100 maps ram air cooling effectiveness 1105 on the vertical axis against vehicular velocity 1110 on horizontal axis, measured in one or both of miles per hour (mph) or kilometers per hour (km/h) or some other units of measurement for velocity. In the illustrated embodiment, ram air cooling effectiveness can be measured using a 0 to 1.25 relative scale, with ideal cooling air flow represented with a value of 1 value, minimum cooling threshold being a value of 0.7, and maximum effectiveness being a value of 1.25. Two plot lines are provided within velocity chart 1100, AHU cooling effectiveness 1115 and ram air cooling effectiveness 1120. As shown, the effectiveness of ram air cooling (plot line 1120) increases proportionally with an increase in velocity. The level of increase in ram air effectiveness changes after the vehicles velocity surpasses the ideal velocity 1140 which causes or corresponds to ideal cooling air flow 1145 for keeping operating IT equipment 120 within the correct temperature range. As indicated at velocity=0, i.e., when VC MDC 100 is stationary, AHU cooling 1115 is utilized to provide all of the cooling air required to keep IT equipment 120 at the temperature threshold for continued operation. The amount of AHU cooling 1115 then decreases in direct proportion to the increase in the amount of ram air cooling. At mid-velocity point 1130, the two air sources provide roughly 50% of the cooling air, with the ram air cooling values increasing and the AHU cooling 1115 values decreasing. The velocity continues to increase, increasing the ram air cooling effectiveness and decreasing the reliance on AHU cooling 1115. This period of mixed or hybrid mode cooling operation is referenced on the chart as AHU-assist mode. At the next identified velocity, threshold velocity 1135, the ram air velocity is sufficient to provide the minimum amounts of cooling air to sustain IT equipment operation, and the AHU is turned off, conserving power. This period of operation is referenced on the chart as fully ram air mode. Threshold velocity 1135 coincides with minimum required cooling air line 1125, which is the minimum amount of cooling air required for the IT equipment 120 to operate within VC MDC 100. This value also represents the amount of ram air cooling that is sufficient for IT equipment 120 operation. Thus, threshold velocity 1135 is the minimum velocity required for operating IT equipment when there is no AHU cooling available. The actual velocity that corresponds to threshold velocity 1135, can vary from one VC MDC to another, and the disclosure contemplates each VC MDC having a different threshold velocity value, in part based on a plurality of factors from among which IT equipment is being operated within IT compartment, actual processing operations being performed on the IT equipment, physical size of the IT compartment, physical size of the air intake opening, aerodynamics of the vehicle, etc.

Ideal cooling air flow 1145 represents the air flow generated at a next higher velocity 1140 that allows for most efficient operation of IT equipment. Above this velocity 1140, the effectiveness of higher velocity cooling air increases at a slower rate and eventually caps out. This capping out of cooling air effectiveness can result from IT equipment 120 reaching a power cap or a maximum processing speed, as two alternate embodiments. This period of operation is referenced on the chart as dampered ram air mode. The shaded section of velocity chart 1100, region 1150, represents the velocity values that generate effective ram air cooling sufficient to enable IT equipment 120 continued processing during movement of VC MDC, without any external and/or internal air movers or supplemental cooling. This, for example, in a completely fanless mobile MDC, active fans can be utilized at the docking location while VC MDC 100 is stationary. Then, as VC MDC 100 becomes mobile and/or during periods of low-speed, the management IHS sets the IT equipment 120 to standby-mode. The IT equipment is then activated to full IT processing load once the VC MDC has achieved a steady-state velocity (i.e., threshold velocity 1135) capable of adequately cooling the IT equipment/hardware.

According to one aspect, in a system where either VC MDC or the IT equipment itself have active air movers, management IHS 600 is configured to perform velocity-based power capping, whereby power usage by IT equipment 120 is power-capped (i.e., data processing operation throttled) in response to reduced transport velocity. Velocity based power capping enables management IHS 600 to offset increases in electrical power consumed by the air-moving devices, and increases the overall operational efficiency of VC MDC 100.

Figure 12:
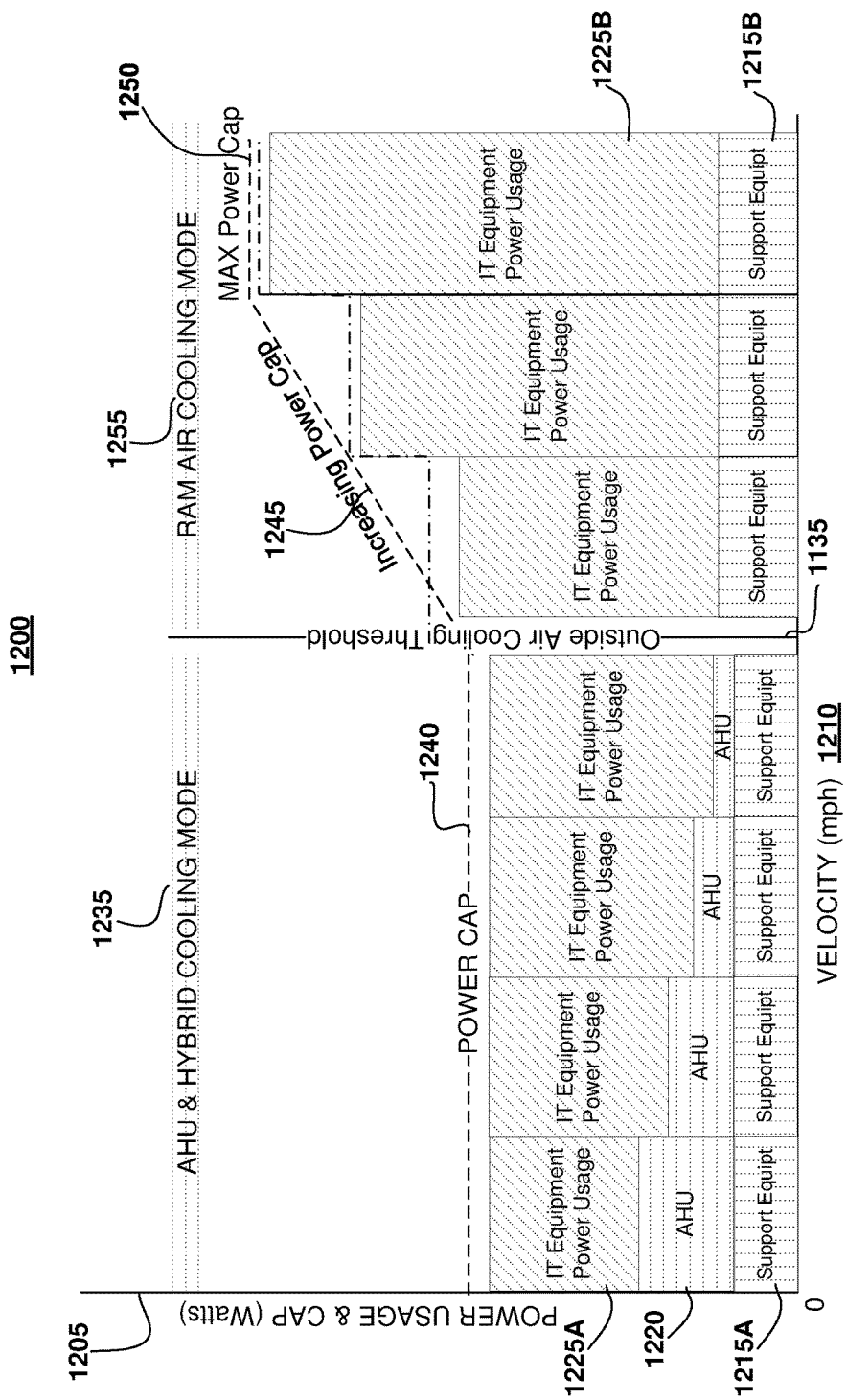
FIG. 12 is a chart illustrating power capping provided based on an amount of onboard power required to support the cooling of IT equipment and the velocity of the VC MDC, according to one or more embodiments.

FIG. 12 is a chart illustrating power capping implemented based on the velocity of VC MDC 100 and the amount of onboard power required to support the cooling of IT equipment, according to one or more embodiments. Power capping chart 1200 provides a mapping of power capping allocations 1205 in Watts, on the vertical axis against velocity 1210 of VC MDC 100 and/or velocity of the transport vehicle in miles per hour, on the horizontal axis. Provided on the velocity axis (1210) is outside air cooling threshold 1135 representing the velocity at which ram air cooling is sufficient to cool the IT equipment and no supplemental cooling is required. An AHU/hybrid cooling mode 1235 is identified to the left of outside air cooling threshold 1135. Ram air cooling mode 1255 is then provided to the right of outside air cooling threshold 1135. Supplemental cooling is required during AHU/hybrid cooling mode 1235. A first power cap 1240 is provided for IT equipment operation during AHU/hybrid cooling mode 1235. First power cap 1240 is identified by the dashed horizontal lines. As shown, VC MDC 100 includes three primary power consumers, support equipment, utilizing a first block 1215A of power, AHU utilizing a second block 1220 of power to provide required cooling, and IT equipment, utilizing a third block 1225 of power. The amount of power required for the support equipment remains somewhat unchanged. However, the amount of power required by the AHU decreases as the velocity of VC MDC 100 increases. This is because of the effects of ram air cooling increasing as the velocity increases. Importantly, the amount of available power for IT equipment processing increases in direct proportion to the decrease and power usage by the AHU. Thus within available power cap 1240 provided to power the overall VC MDC 100 during periods of low velocity that requires utilization of supplemental cooling, the AHU usage of power directly (negatively) affects the availability of power to the IT equipment for data processing. Once the velocity reaches and surpasses the outside air cooling threshold velocity 1135, VC MDC 100 enters into ram air cooling mode 1255. In this mode of operation, management IHS 600 is able to increase the power cap up to a maximum power 1250. It is appreciated, that gradually increasing the power cap 1245 is provided solely for illustration of the availability of additional power correlated directly to increases in the velocity. As illustrated by power capping chart 1200, management IHS 600 implements the increases in the power cap using stepped increases. Notably, during ram air cooling mode 1255, no power is allocated to AHU, and the amount of power available for IT equipment processing (1225B) increases as the velocity increases due to the availability of the enhanced cooling provided by the increase flow of ram air as the velocity increases. This increase in available power may also be provided to the support equipment power 1215B, which may be required to support the increased processing load of IT equipment. It is appreciated, that the actual increases in the power cap may be limited by the amount of total available power within the VC MDC power system.

FIG. 13 provides a flow chart illustrating method 1300 for implementing power capping to conserve available onboard power for IT equipment processing, based on availability of ram air cooling to support heat removal from the operating IT equipment 120, according to one or more embodiments. Method 1300 is described with reference to FIG. 12. Method 1300 begins at the start block and proceeds to block 1302 which provides management IHS 600 detecting a velocity of VC MDC (100) relative to an outside air cooling threshold velocity. Management IHS 600 determines at block 1304, based on the detected velocity, whether VC MDC (100) is operating in an AHU/hybrid cooling mode 1235. In response to determining at block 1304 that VC MDC (100) is operating in the ram air cooling mode 1255, based on the detected velocity of VC MDC (100), management IHS (600) selects a second power cap value to apply to IT equipment operation (block 1306). The second power cap value can be a highest power cap value supported by the amount of ram air cooling being provided. Method 1300 returns to block 1302.

In response to determining at block 1304 that VC MDC (100) is operating in the AHU/hybrid cooling mode 1235, method 1300 includes selecting a lower power cap value to apply to IT equipment operation (block 1308). The lower power cap value is selected as a response to reduced transport velocity to increase the overall operational efficiency and offset increases in electrical power consumed in order to power the air-moving devices. From block 1308, method 1300 further includes identifying whether VC MDC (100) is stationary and is coupled to an externally powered cooling air source (block 1310). In response to identifying that VC MDC (100) is receiving cooling air flow from an externally powered cooling air source, method 1300 further includes management IHS 600 increasing the power cap from the first power cap 1240 up to a highest power cap supported by the amount of cooling air being received (block 1312). In one embodiment, the highest power cap is maxed power cap 1250. It is appreciated that management IHS 600 increases the power caps based on the amount of cooling air flow and the resulting effects on the ambient temperature within the IT compartment. At block 1314, method 1300 includes determining if removal of the externally powered cooling air source is detected. In response to detecting removal of the externally powered cooling air source, method 1300 transitions back to block 1302. In response to not detecting removal of the externally powered cooling air source, method 1300 transitions back to block 1310.

In embodiments where VC MDC does not include any onboard secondary cooling source (i.e., a fan-less MDC), management IHS 600 enables processing by IT equipment with the use of active fans provided at the docking location while VC MDC (100) is stationary. In other situations where VC MDC (100) is stationary and or VC MDC (100) is moving at a velocity below outside air cooling threshold velocity 1135, management IHS 600 sets the IT equipment to standby-mode. Management IHS 600 then activates full IT processing load once the transport vehicle has achieved a steady-state velocity capable of adequately cooling the IT equipment/hardware.

Pre-Heating Supply Air for it Equipment Utilizing Transport Vehicle Waste Heat

With the use of external air to provide the cooling air flow, situations arise where the ingested ram air can actually be too cold for one or more of the IT equipment to operate. In colder parts of the country and during winter months, for example, ambient conditions around the VC MDC may make the conditions in the IT compartment too cold, and thus non-ideal for the processing equipment. Minimizing the airflow from the ram air may not be a viable solution, particularly with fan-less implementations of VC MDCs where the VC MDC relies solely on the ram air to provide cooling air flow for the other IT components that require a source of cooling air. For systems with an onboard fans that can recirculate exhaust IT air, the amount of heat absorbed by the recirculating air from the IT components may not be sufficient to bring the overall ambient temperature up to the desired level for efficient processing operations by the IT components.

During transport of VC MDC 100, and while IT equipment 120 is performing data processing operations, the VC MDC 100 can be located within geographic areas where the exterior air temperatures are sufficiently below the threshold minimum temperature necessary critical IT components (e.g., rotating HDDs, battery back-up units, etc.) that are important to the IT infrastructure to support the processing operations. Because the VC MDC 100 relies on the exterior air to provide the required cooling for other heat generating components, such as the CPUs of the IT equipment, stopping the intake of cold exterior air as ram air is not desired. This disclosure provides a series of methods to mitigate and increase the lower temperatures of the ram air involving the reconfiguration of the cooling system to selectively introduce the combustion engine's exhaust heat to pre-heat the ingested ram air.

Figure 14A:
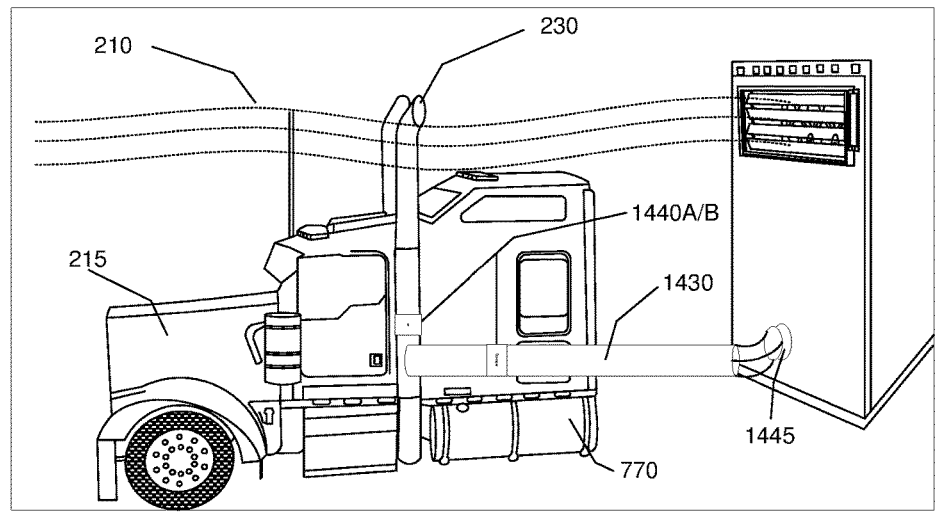
FIGS. 14A-14C provide three illustrations depicting the use of exhaust air from the combustion engine of the transport vehicle to modulate the temperature of the outside air being used to cool and/or heat the IT equipment operating within the VC MDC, in accordance with one or more embodiments.
Figure 14B:
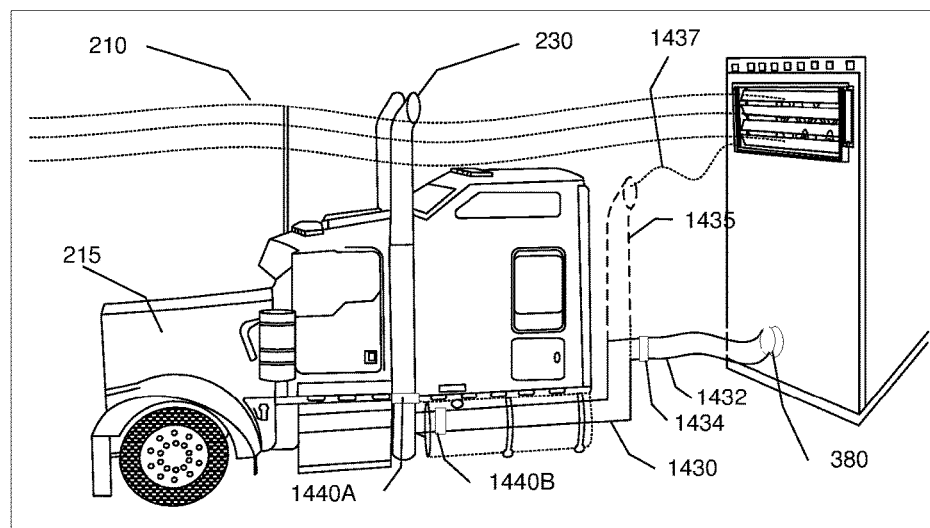
Figure 14C:
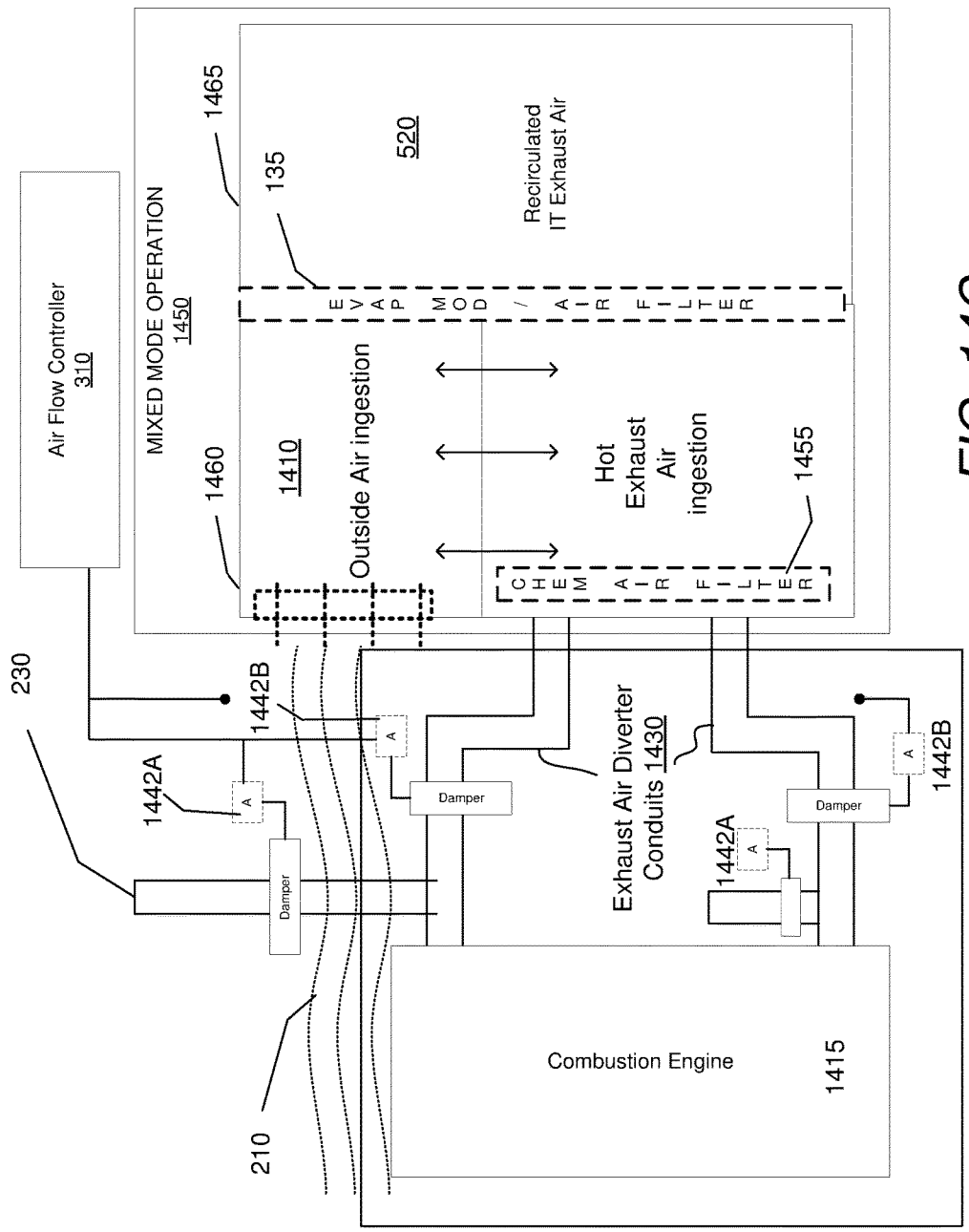

With reference now to FIGS. 14A-14C, there are provided three illustrations depicting the ingestion of exhaust heat that was emitted from the combustion engine of the transport vehicle into VC MDC 100 to modulate (i.e., raise) the temperature of the ingested outside air being used to cool and/or heat the IT equipment operating within VC MDC 100. FIGS. 14A and 14B illustrates different implementations/methods for routing heated exhaust air from transport vehicle 205 into VC MDC 100. As indicated, transport vehicle 205 includes combustion engine 215 (located below the hood) that is powered by fuel stored in fuel tank 770. As combustion engine 215 burns fuel to produce the energy that enables transport vehicle 205 to move, hot exhaust air is generated and exits combustion engine 215 via one or more exhaust pipes 230. In the illustrated embodiments, exhaust pipes 230 are modified to include an exhaust air diverter conduit 1430. Exhaust pipes 230 and exhaust air diverter conduit 1430 are both retrofitted with dampers 1440 that can be moved from an open to a closed position. As illustrated by the embodiment in FIG. 14C, dampers are connected to actuators 1442A, 1442B, which are communicatively coupled to airflow controller 310. Actuators enable dampers 1440A, 1440B to be moved from a close position to an open position and vice versa. Notably, exhaust pipe dampers 1440A are placed in a closed position whenever exhaust air diverter dampers 1440B are placed in an open position. Thus, dampers 1440A, 1440B are operated as mutually exclusive dampers (i.e. only one of the two dampers can be opened at a time). In one embodiment, dampers and actuators can be replaced with electronic valves that are designed with built-in actuators that open and close the valves in response to a trigger from a wired or wirelessly connected remote controller, such as air flow controller 310. As shown in FIG. 14B, the extended end of exhaust air diverter conduit 1430 includes a connector 1434 to which flexible conduit 1432 is connected and extended towards and received at exhaust air intake 380 within the front/adjacent wall surface of VC MDC 100.

In one embodiment, illustrated by FIG. 14B, the end of exhaust air diverter conduit 1430 can be extended upwards to create a secondary exhaust pipe 1435 having an open end placed proximate/adjacent to the outside of ram air intake opening 132 (FIG. 1B) such that the hot exhaust air 1437 is ingested along with the ram air 210 coming in from the environment. Alternatively, a location and/or height of air exhaust pipe 230 can be modified such that the open end of or air exhaust pipe 230 releases hot exhaust air adjacent to the air intake opening, similar to secondary exhaust pipe 1435. With these implementations, immediate mixing of the hot exhaust air 1437 and ram air 210 occurs at the shared intake location and thus ingested ram air is automatically heated.

With alternate implementations, an end of the exhaust air conduit 1430 is fluidly coupled to the interior of VC MDC 100 via exhaust air intake conduit 380, and the mixing of the two air sources (assuming there is ram air 210 being ingested) would occur on the interior of VC MDC 100. It is appreciated that aspects of the present disclosure includes the producing of exhaust air by combustion engine 1415 operating in an idle state, when the transport vehicle is not actually moving. Thus, a direct connection of exhaust air diverter conduit 1430 to VC MDC 100 is provided in the illustrated embodiments. While the location of the exhaust air diverter conduit 1430 is shown extending along the outside of transportation vehicle, the actual location of the conduits can be in another location relative to the transportation vehicle. For example, the exhaust air diverter conduit 1430 can run underneath the cab of transportation vehicle 205 and extend backwards towards the connection point at which VC MDC 100 is hitched on to transport vehicle 205.

FIG. 14C provides a more detailed block diagram representation of the use of heated exhaust air from a combustion engine to provide heating for cold ram air being ingested in VC MDC 100. FIG. 14C is described with continuing reference to FIGS. 1A, 3A, and 5. The re-routing and ingestion of exhaust air generated by combustion engine have been described with reference to FIGS. 14A-14B. As further illustrated by FIG. 14C, the ingestion of exhaust air into VC MDC 100 provides for a hybrid mixed mode operation 1450 of air cooling that is controlled by airflow controller 310. Within mixed mode operation 1450 the ingested hot exhaust air 1437 is mixed with the ingested ram air 210 in air intake chamber 1410 of VC MDC 100. Mixing of the hot exhaust air 1437 and ram air 210 can be accomplished by one or more methods including, for example, the inclusion of a small fan within the air intake chamber 1410. According to one embodiment, the ingested hot exhaust air is first filtered using interior air filter 1455 to remove potentially harmful contaminants that may have been generated as a byproduct of the chemical reactions that occur in combustion engine 1415. Interior air filter 1455 can be a catalytic converter or other chemical filter that removes corrosive chemicals, such as sulfur, which are byproducts of (i.e., waste produced by) combustion engine 1415. The mixed air within intake chamber 1410 then passes through main evap medium/air filter 135 before reaching cold aisle 520 of IT compartment 110.

Additionally, in the embodiment in which VC MDC 100 includes AHU 350, and as provided in FIG. 5, IT exhaust air 510 can also be provided in a recirculation loop controlled by AHU 350. Management IHS 600 triggers AHU controller 355 to recirculate IT exhaust air 510 as presented in the description of the flowchart of FIG. 14C. Airflow controller 140 triggers diversion of combustion engine exhaust air 1437 into the air intake chamber 520 (FIG. 13A). Management IHS 600 also triggers AHU controller 355 to recirculate IT exhaust air 510 (FIG. 13B).

Figure 15:
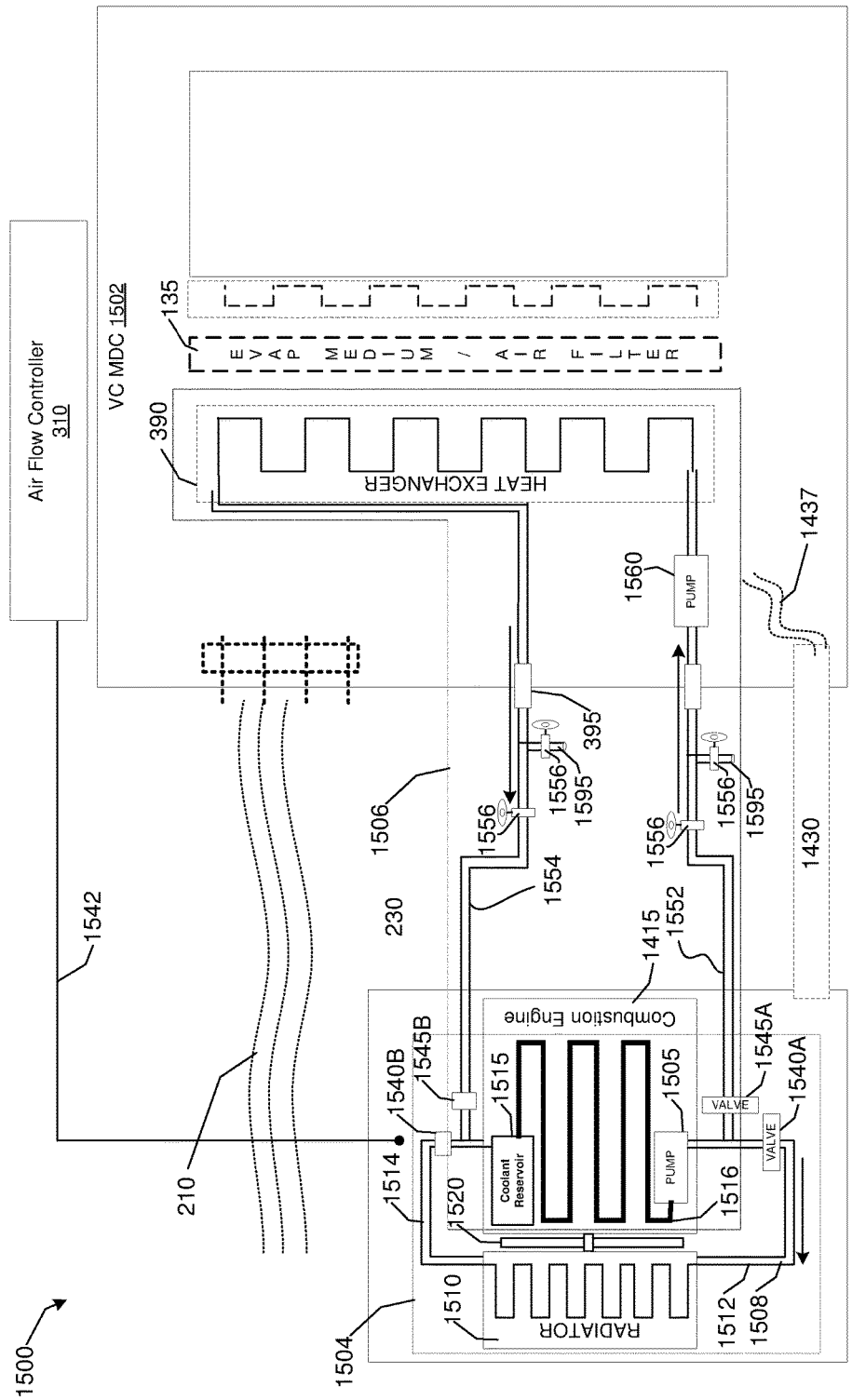
FIG. 15 is a block diagram illustration of the use of liquid-to-liquid heat exchanger within VC MDC to enable heating of ingested ram air using heat from vehicles combustion engine, in accordance with one embodiments.

FIG. 15 is a block diagram illustration of a liquid to liquid heat exchanger within VC MDC that provides heating for ingested ram air using heat from the transport vehicle's combustion engine, in accordance with one or more embodiments. Vehicle-attached VC MDC 1500 includes air-to-liquid heat exchange subsystem 1504 within combustion engine 1415 and liquid-to-air heat exchange subsystem 1506 extended within air intake compartment 1460 of enhanced VC MDC 1502. As illustrated, combustion engine 1415 includes first heat exchange loop (1504) of interconnected conduits through which a volume of heat absorbing liquid 1508 (e.g., water) flows to absorb heat generated by combustion engine 1415. First heat exchange loop 1504 includes radiator 1510, which includes radiator pipes that are in fluid connection with intake conduit 1512 and outflow conduit 1514. The intake and outflow conduits 1512, 1514 connect at their other end to pump/compressor 1505 and coolant reservoir 1515, respectively. Heat transfer pipes 1516 extend between coolant reservoir 1515 and pump/compressor 1505, completing the first heat transfer loop 1504. Liquid coolant flowing through heat transfer pipes 1516 absorbs the heat being generated by combustion engine 1415. The heated liquid coolant is then channeled/push by pump 1505 through intake conduit 1512 to radiator 1510. At radiator 1510, the liquid-absorbed heat is dispelled from the liquid coolant to air by operation of air mover (fan) 1520 generating a flow of air across the radiator pipes (1510).

As further illustrated, liquid-to-air heat exchange subsystem 1506 includes second heat exchange (HE) loop (1506) that includes a liquid-to-air heat exchanger 390 located within enhanced VC MDC 1502. Liquid-to-air heat exchanger 390 is connected by HE intake conduit 1552 and HE outflow conduit 1554 to respective junctions with intake conduit 1512 and outflow conduit 1514 of first heat exchange loop 1504. In one embodiment, the actual connections of HE intake conduit 1552 and HE outflow conduit 1554 can be directly to pump 1505 and coolant reservoir 1515, respectively. HE intake conduit 1552 and HE outflow conduit 1554 are connected to connectors 395, located on an exterior of VC MDC 1502. According to one embodiment, as illustrated by FIG. 7, connectors 395 can operate as cooling liquid intake connectors 395 when VC MDC 1502 is parked at a data center facility. In the present embodiment, a secondary cooling liquid intake 1595 is provided for connecting to facility cooling liquid supply. The source of liquid flowing through LTA HE 390 can thus be changed from hot exhaust fluid from combustion engine 1415 or cooling liquid from facility supply 735. To facilitate this dual operation capability, HE intake conduit 1552 and HE outflow conduit 1554 include dual shut-off valves 1556 that can be selectively placed in an open position or a closed position. Liquid flow occurs whenever a valve is in an open position and no liquid flow occurs when the valve is in a closed position. In one embodiment, control of the valve can be automated via the use of air flow controller 310 or other device, such as management IHS 600.

In one embodiment, second heat exchange (HE) loop (1506) can include a second pump 1560 located internal to enhanced VC MDC 1502. Second pump 1560 supports the longer distance that liquid coolant has to travel within VC MDC 1502. Second pump 1560 can be located on the outflow conduit side of heat exchanger 390. Liquid-to-air heat exchanger 390 is positioned in the path of the flow of ingested ram air 210 before evap. medium/air filter 135. In alternate embodiments, liquid-to-air heat exchanger 390 can be positioned at a different location within the flow path of ingested ram air 210, prior to ram air reaching the IT chamber (not shown). The second, dashed representation of heat exchanger indicates one possible location of heat exchanger after the ram air 210 has passed through evap. medium/air filter 135.

In the illustrative embodiment, each of intake conduit 1512 and HE intake conduit 1552 and each of outflow conduit 1514 and HE outflow conduit 1554 is configured with an actuator valve (1540A, 1540B and 1545A, 1545B) that controls the flow of cooling liquid through the respective conduit. Each actuator valve can be selectively placed in one of an open or a closed position. In one embodiment, the actuator valves can be partially opened (partially closed) enabling the cooling liquid to continue to flow through the respective conduit at a reduced flow rate thus effecting less heat transfer. Valves connected to intake conduit and outflow conduit of first heat exchange loop are both placed in the same open/close state. Likewise, valves connected to HE intake conduit and HE outflow conduit of second heat exchange loop are placed in the same open/close state. When the valves associated with first heat exchange loop are open, the valves associated with the second heat exchange loop are closed, and vice versa.

Actuator valves 1540A/B, 1545A/B can be configured as manual valves in one embodiment. In the illustrated embodiment, actuator valves are automated valves that are controlled by intake air controller 310 using example signal line 1542. It is appreciated that each actuator valve 1540A/B, 1545A/B may have a separate signal line from airflow controller 310, in one embodiment. The paired valves can be configured to operate in tandem. For example, a first pairing of valves (e.g., 1540A/B) can be open, while a second pairing of valves 1545A/B is closed, and vice versa. Alternatively, the paired values may operate independent of each other, where the two loops are partially opened to allow for maximum heat dissipation from combustion engine 1415 with some of the heat being exhausted to the environment through radiator 1510 and the remainder of the heat being utilized to heat the ingested ram air at heat exchanger 390. With the configuration provided in FIG. 15, intake air controller 310 can regulate the temperature of ingested ram air by opening the valves 1545A/B to the second heat exchange loop 1506 while concurrently closing the valves 1540A/B to the first heat exchange loop 1504.

The above description provides a liquid-to-liquid interconnect that enables liquid coolant from the transport vehicle's engine (e.g., ethylene glycol (antifreeze)) to be routed to a secondary liquid to air heat exchanger (radiator) placed upstream of the server airflow intake within VC MDC 100. With these embodiments, the waste heat of the vehicle's combustion engine is dissipated into the ram air intake, and then the liquid coolant is cycled (or pumped) back to the combustion engine. It is appreciated that the various conduits described herein for liquid transfer or air transfer can be flexible conduits, although rigid conduits may also be utilized in addition to or in place of flexible conduits, in different implementations.

It is further appreciated that while the engine is illustrated and described as a combustion engine, the functionality provided is equally applicable for implementation with an electric engine, which also produces significant waste heat. This heat which is required by the VC MDC is parasitic to engine operation and must be dissipated away, while being helpful to processing operation of the VC MDC.

Figure 16:
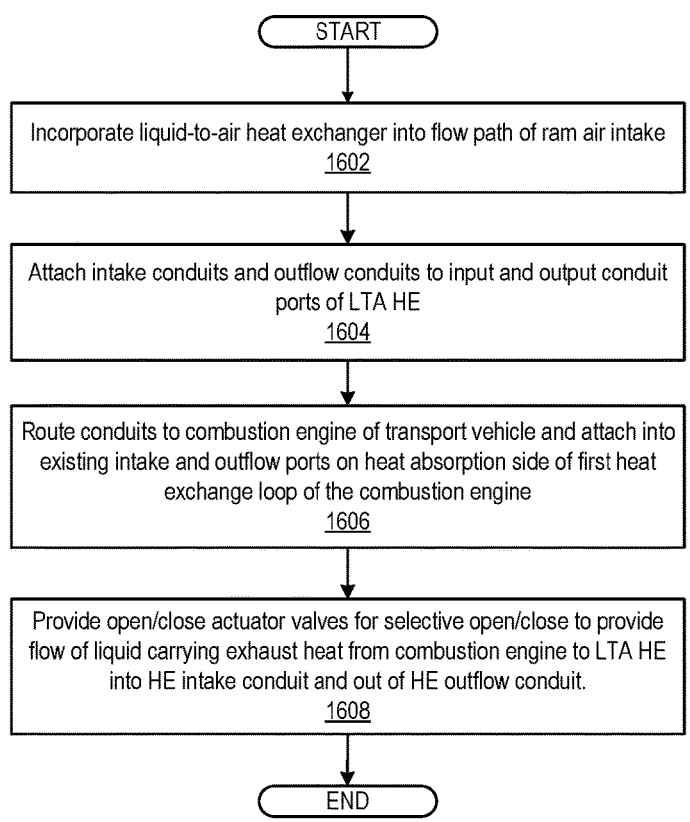
FIG. 16 is a flow chart illustrating the method for configuring VC MDC and its transport vehicle to utilize residual/exhaust heat from the combustion engine of the transport vehicle to modulate the temperature of the outside air being used to cool and/or heat the IT equipment operating within the VC MDC, in accordance with one or more embodiments.

FIG. 16A is a flow chart illustrating the method for configuring VC MDC and its transport vehicle to utilize exhaust heat from the combustion engine of the transport vehicle to modulate the temperature of the outside air being ingested into the VC MDC, in accordance with one or more embodiments. In one embodiment, method 1600 provides configuring VC MDC and its transport vehicle to utilize liquid to liquid heat exchange between the combustion engine of the transport vehicle and the intake ram air system of the VC MDC to modulate the temperature of the outside air being ingested into the VC MDC.

Method 1600 begins at start block and proceeds to block 1602 at which method includes incorporating a liquid-to-air heat exchanger (LTA HE) into the flow path of the ram air intake opening. At block 1604, method 1600 includes attaching intake conduits and outflow conduits to the input and output conduit ports of the LTA HE. At block 1606, method 1600 includes routing the HE conduits to the combustion engine of the transport vehicle that has a first liquid to air heat exchanger loop, and fluidly attaching the HE conduits to existing intake and outflow conduits or conduit ports on the heat absorption side of the first LTA exchanger loop of the combustion engine. At block 1608, method 1600 includes providing open/close actuator valves for the HE conduit connections at the first LTA exchanger loop to allow for quick open/close of the HE intake conduit to receive flow of liquid carrying exhaust heat from combustion engine to the LTA HE.

FIG. 17 is a flow chart illustrating one example of the method by which the temperature of the VC outside air is modulated using exhaust heat from the combustion engine of the transport vehicle to provide proper ambient conditions for the operation of the IT equipment within desired temperature ranges, according to one or more embodiments. Method 1700 begins at start block and proceeds to block 1702 with air flow controller 310 receiving a temperature reading of the ingested ram air. At block 1704, air flow controller 310 determines if the ram air temperature is below a desired temperature for the IT equipment operation (i.e., too cold). If the air is not below the desired temperature, method 1700 returns to block 1702 with the air flow controller continuing to monitor the temperature of the ingested ram air. In response to the temperature of the ram air being too cold, method 1700 includes air flow controller 310 enabling or completing the connection/coupling of a heat exhaust heat subsystem from the combustion engine of the transport vehicle to provide secondary heat for the ingested ram air.

As further shown by the bottom blocks of FIG. 17, method 1700 further includes the air flow controller triggering one or more actuator values or dampers to open in order to allow a flow of exhaust heat (in an air or liquid medium) towards VC MDC (block 1708). At decision block 1710, Method 1700 includes air flow controller 310 determining whether the ingested ram air temperature is acceptable (i.e., above a minimum temperature threshold and thus no longer too cold for operating the IT equipment). In response to the temperature of the ingested ram air being at or above the desired minimum temperature threshold, method 1700 includes air flow controller 310 closing the actuator valves and/or dampers to stop the flow of the exhaust heat towards/into VC MDC (block 1712). Method 1700 then returns to block 1702. In response to the ingested ram air temperature with the added heat absorption from the LTA HE still not being acceptable, method 1700 includes the air flow controller partially closing air intake damper 130 to throttle the rate of ingestion of ram air (block 1714). Method 1700 then returns to block 1708.

As one additional aspect, the above features can also be implemented within VC MDC operating in a hybrid cooling/heating mode, where an AHU or other source of cooling air is present. The air flow controller 310 can signal management IHS to initiate recirculation of IT exhaust heat (air heated from passing over/through the IT equipment) based on identifying that the ingested ram air is too cold and requires heating. In this scenario, in response to the current ambient temperature internal to the IT compartment being below the minimum desired operating temperature, method 1600 can include triggering the air flow controller to close an exhaust damper of the VC MDC, and recirculating exhaust air from a hot aisle of the IT chamber to an air intake chamber of VC MDC. Concurrently with closing the exhaust damper, method 1600 can further provide the air flow controller 310 at least partially closing the air intake damper to prevent ingestion of more cold air and/or to regulate an air pressure within VC MDC, while opening the dampers and/or actuator valves to allow for the flow of exhaust heat from combustion engine into the path of ram air intake.

In one embodiment, rather than simply relying on the temperature of the outside air to trigger external heating, air flow controller or management IHS receives the current external air temperature and compares the current outside air temperature to the IT compartment temperature. In response to the external air temperature reading indicating that an external temperature is below the current temperature within the IT compartment while the IT compartment temperature is below the threshold minimum temperature, the air flow controller then triggers the opening of the valves/dampers to receive exhaust heat from the combustion engine. However, in very extreme conditions, method 1600 can include fully closing the air intake damper to prevent ingestion of more cold air when the secondary heat source is not sufficient to heat the ram air up to the desired temperature. The VC MDC then operates in a closed mode of recirculating air by the AHU.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A velocity cooled (VC) mobile data center (MDC) comprising:
    a volumetric container having a plurality of exterior walls, with a first aft-facing wall and at least one second side or rear facing wall, the container configured with an information technology (IT) compartment and designed for placement on a trailer capable of being moved in at least an aft-facing direction at a velocity that facilitates cooling air flow through the IT compartment;
    at least one heat generating information technology (IT) equipment positioned within the IT compartment, the IT equipment comprising at least one IHS;
    an air intake opening placed in the aft-facing wall and which provides an air intake path for exterior air to ingress into the container at a high velocity to provide a flow of cooling air that cools the at least one heat generating IT equipment while the trailer is moving in the aft direction;
    an air intake damper positioned within the air intake opening and capable of being selectively positioned in one of a plurality of air intake positions, ranging from a fully open position to a fully closed position;
    at least one air handling unit (AHU) located within a second compartment of the container, the at least one AHU being configurable to selectively operate in one of a standby mode and an active mode, the active mode ranging from a first active mode providing minimal airflow to a second active mode providing a maximum airflow, the AHU selected to operate in the active mode based on an amount of cooling air being ingested at the air intake opening; and
    a management IHS that controls the operation of the IT equipment and the at least one AHU based in part on a velocity of the VC MDC.

2. The VC MDC of claim 1, wherein the at least one AHU, when in an active mode, operationally pulls air from a front section of the container to a rear section of the container, causing ingestion of cooling air and directional movement of the ingested cooling air over the at least one heat generating IT equipment to convectionally remove heat generated by operation of the at least one heat generating IT equipment.

3. The VC MDC of claim 1, further comprising:
    an actuator connected to the air intake damper and which enables positioning of the air intake damper into one of the plurality of air intake positions; and
    a controller that is communicatively coupled to the actuator and which provides a trigger signal to the actuator to direct the actuator to place the air intake damper into a specific air intake position.

4. The VC MDC of claim 1, further comprising:
    at least one air outflow opening having an air outflow damper and positioned in one of the walls of the volumetric container, the at least one air outflow opening positioned to enable the flow of cooling air to exit the container as exhaust IT air after the cooling air flows over and convectionally absorbs heat from the at least one IT equipment;
    a second actuator connected to the air outflow damper and which enables positioning of the at least one air outflow damper into one of a plurality of air outflow positions; and
    a controller that is communicatively coupled to the second actuator and which provides a trigger signal to the second actuator to direct the second actuator to place the air outflow damper into a specific air outflow position.

5. The VC MDC of claim 3, further comprising:
    at least one sensor communicatively coupled to the controller and which senses a respective at least one environmental or ambient condition;
    wherein the controller receives a value of the respective at least one environmental or ambient condition and selects the specific air intake position of the air intake damper based on a received value from the at least one sensor.

6. The VC MDC of claim 5, wherein the at least one sensor comprises at least one of:
- a velocity sensor that detects the velocity of at least one of: (a) a flow of ambient air moving from the outside into the interior of the container as ram air to provide the cooling air flow for the heat-generating IT equipment; and (b) a movement of the trailer on which the container is affixed for transportation;
- a temperature sensor that detects the temperature of at least one of: (a) the IT equipment; (b) the ingested intake air; (c) the outside air; (d) the IT compartment;
- a humidity sensor that senses a humidity level in at least one of the outside air, the intake air, the IT compartment;
- a chemical sensor which monitors for detection of harmful chemicals in a surrounding environment or ambient air, wherein the VCCS controller responds to detection of harmful chemicals by triggering the actuator to close the air intake damper; and
- an available power sensor.

7. The VC MDC of claim 6, wherein the management IHS responds to detection of a condition that requires use of the AHU to provide cooling air flow by activating the AHU to begin circulating cooling air within the container.

8. The VC MDC of claim 7, wherein the management IHS further responds to detection of a condition that indicates the VC MDC should operate in a closed mode by triggering the actuator to close the air intake damper.

* * * * *